(12) United States Patent
Yoshida et al.

(10) Patent No.: US 6,303,405 B1
(45) Date of Patent: Oct. 16, 2001

(54) SEMICONDUCTOR LIGHT EMITTING ELEMENT, AND ITS MANUFACTURING METHOD

(75) Inventors: Hiroaki Yoshida; Kazuhiko Itaya; Shinji Saito, all of Yokohama; Johji Nishio, Machida; Shinya Nunoue, Ichikawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/404,727

(22) Filed: Sep. 24, 1999

(30) Foreign Application Priority Data

Sep. 25, 1998 (JP) .................................................. 10-272286

(51) Int. Cl.[7] .................................................. H01L 21/00
(52) U.S. Cl. .............................................................. 438/46
(58) Field of Search .................................. 438/34, 46, 47, 438/455, 457, 458, 459, 479, 481, 795, 796, 977, 751; 117/952, 3; 257/13, 14, 15, 22; 372/44, 45

(56) References Cited

U.S. PATENT DOCUMENTS 6,113,685 * 9/2000 Wang et al. ............................. 117/3
6,177,359 * 1/2001 Chen et al. ........................... 438/751

FOREIGN PATENT DOCUMENTS 7-202265   8/1995 (JP) .
9-129984   5/1997 (JP) .

* cited by examiner

Primary Examiner—Keith Christianson
(74) Attorney, Agent, or Firm—Oblon, Spivak, McClelland, Maier & Neustadt, P.C.

(57) ABSTRACT

A semiconductor light emitting element of nitride compound semiconductors excellent in cleavability, heat radiation and resistance to leakage is made by epitaxially grow a nitride compound semiconductor layers on a substrate of sapphire, for example, and thereafter separating the substrate. For separating the substrate, there are a technique using a abruption mechanism susceptible to a stress such as a "lift-off layer" and a recesses on a substrate. A technique using laser light to cause a local dense heat stress at the abruption mechanism is effective. A nitride compound semiconductor obtained by separating the substrate may be used as a new substrate to epitaxially grow high-quality nitride compound semiconductors thereon.

26 Claims, 13 Drawing Sheets

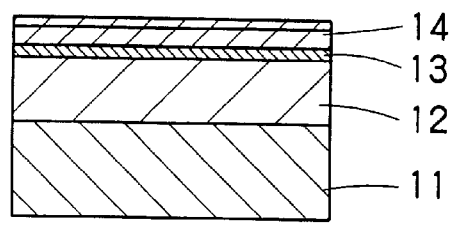
F I G. 1A
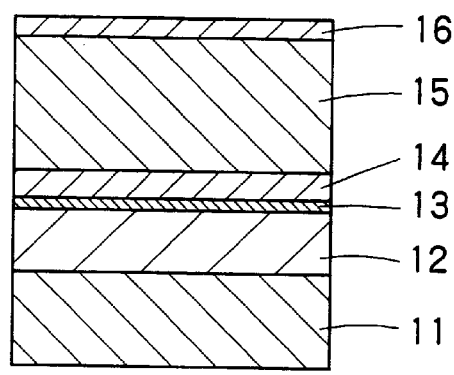
F I G. 1B
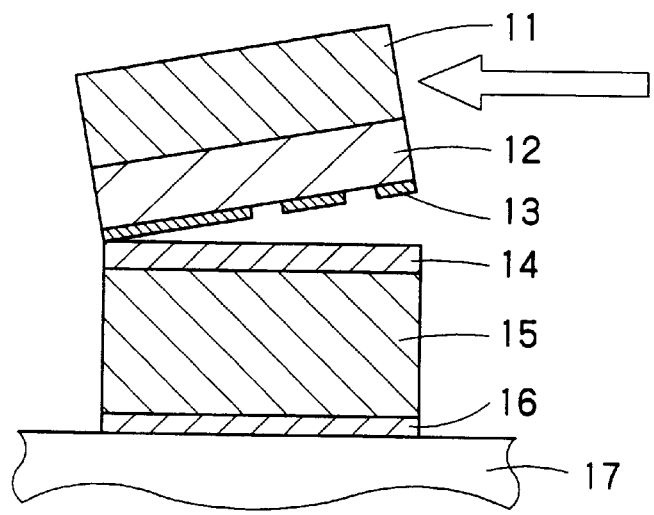
F I G. 1C
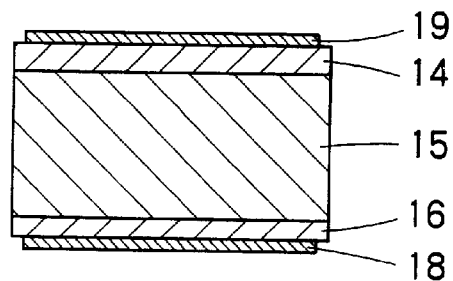
F I G. 1D

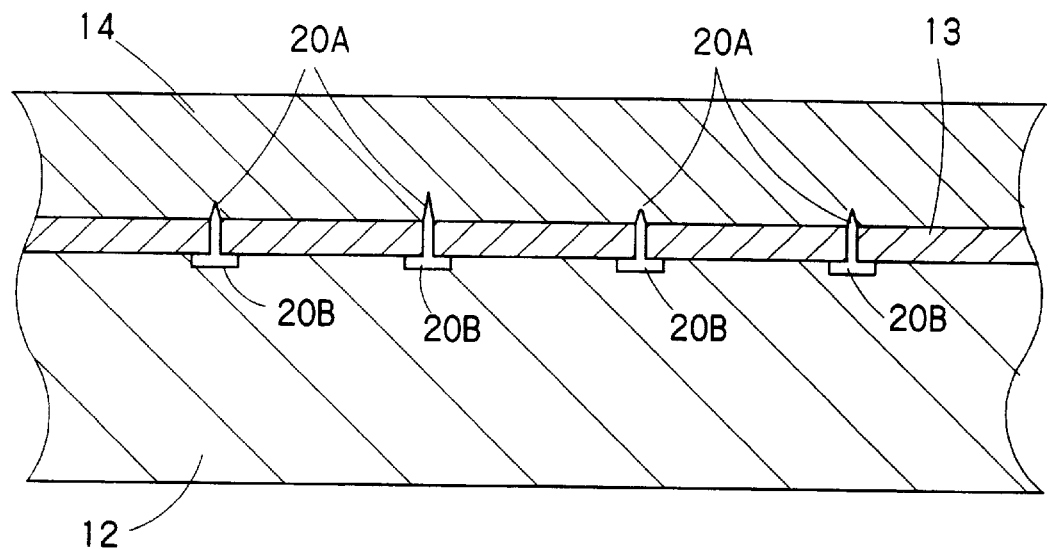
F I G. 2
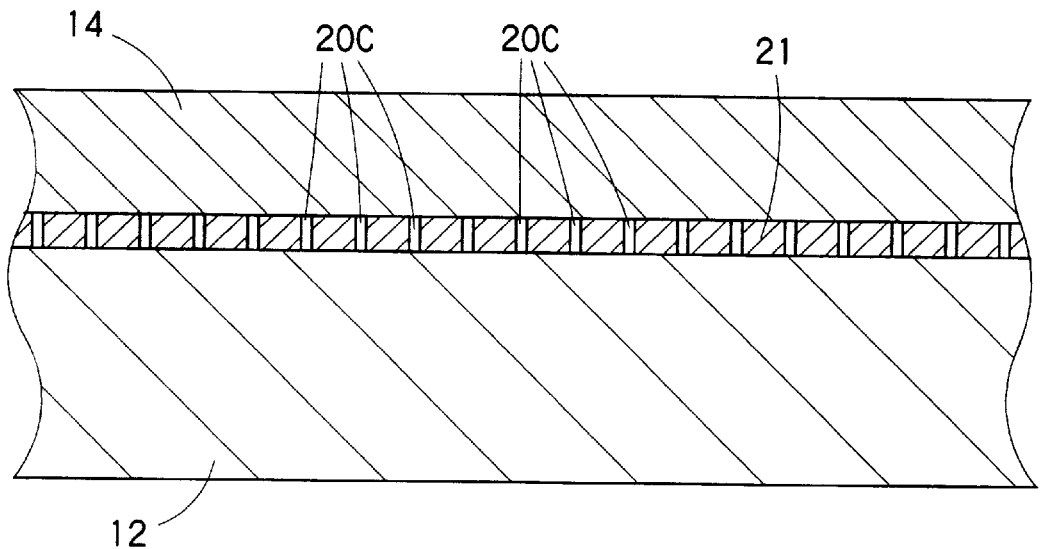
F I G. 3

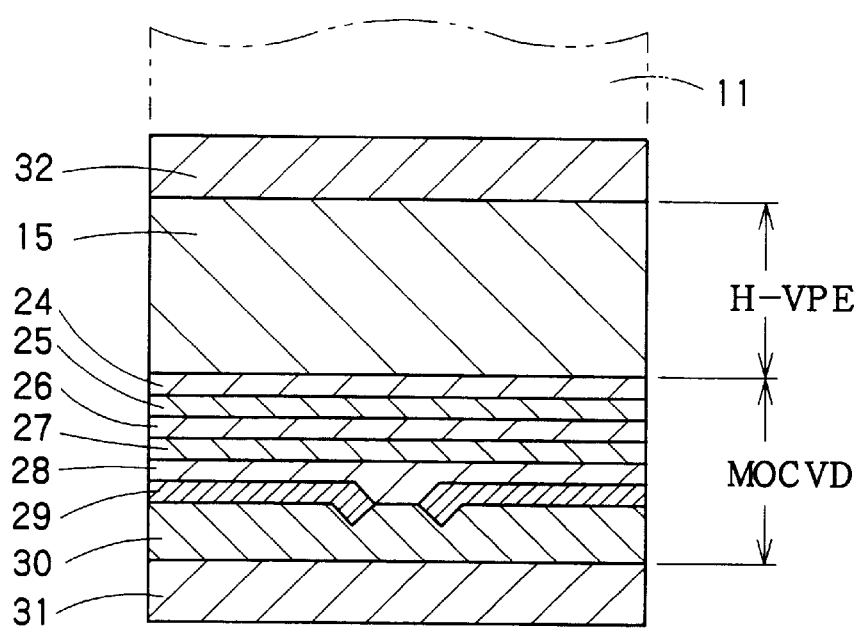
F I G. 4
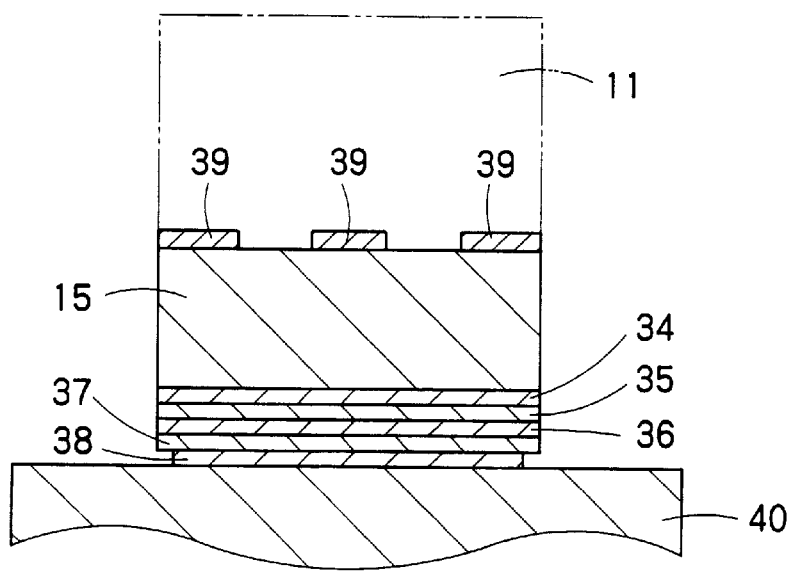
F I G. 5

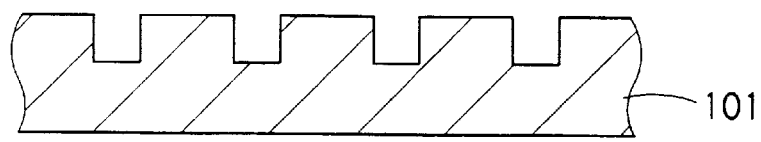
F I G. 6A
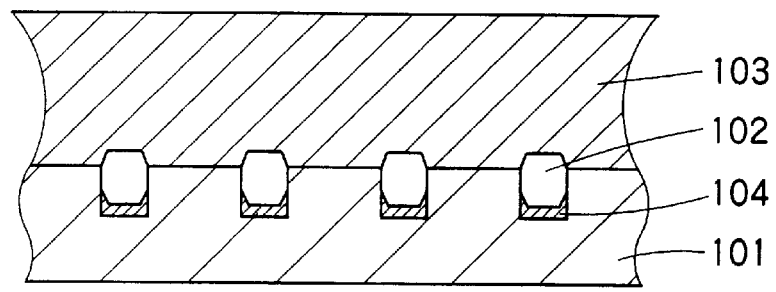
F I G. 6B
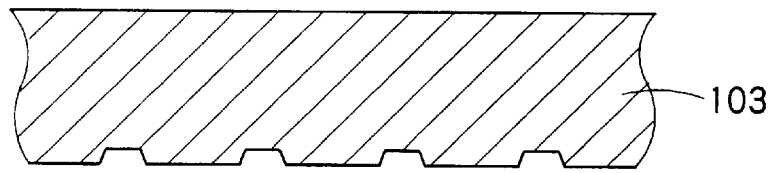
F I G. 6C
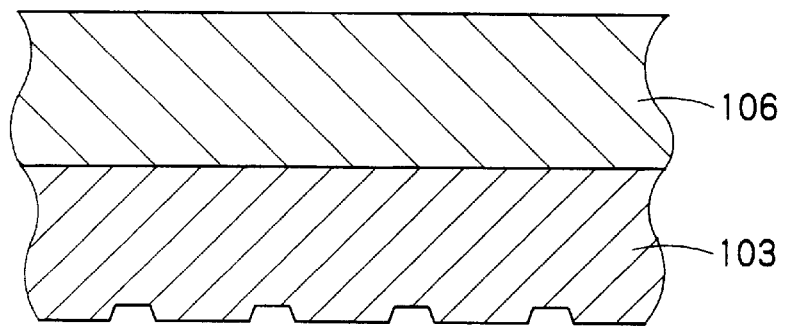
F I G. 6D

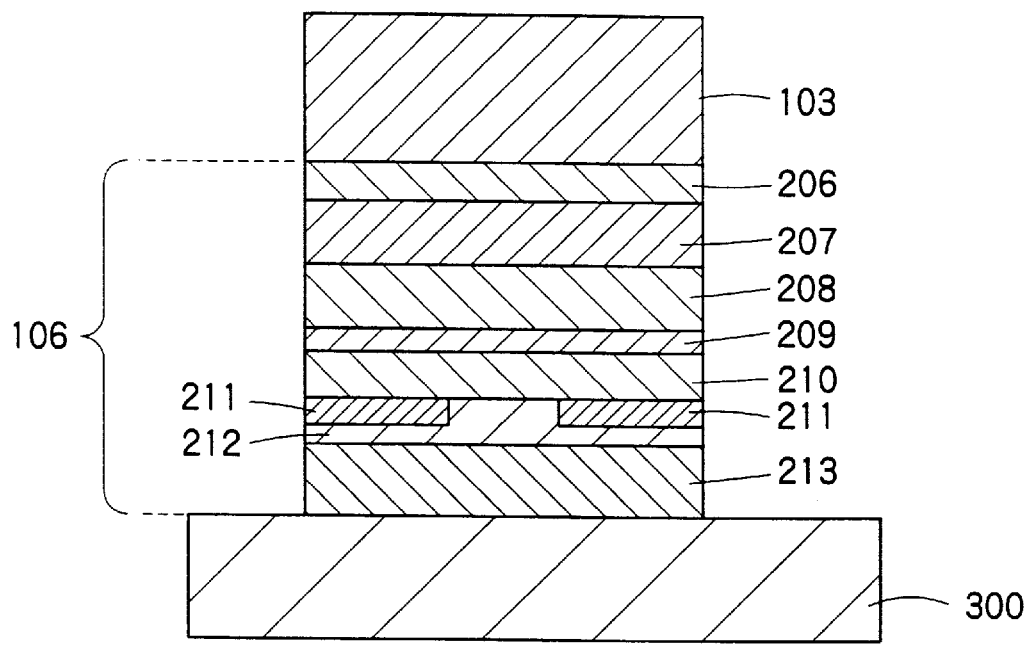
F I G. 7
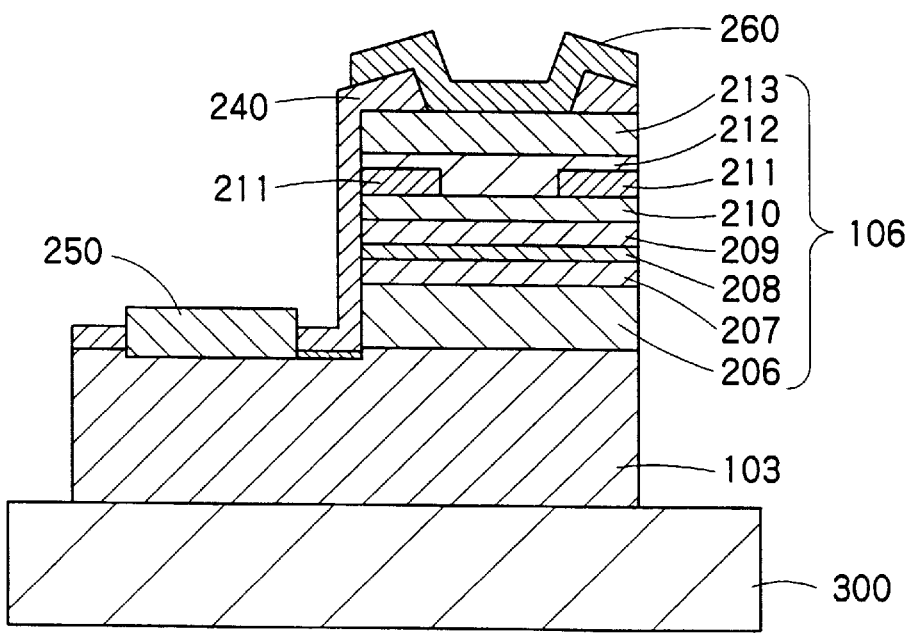
F I G. 8

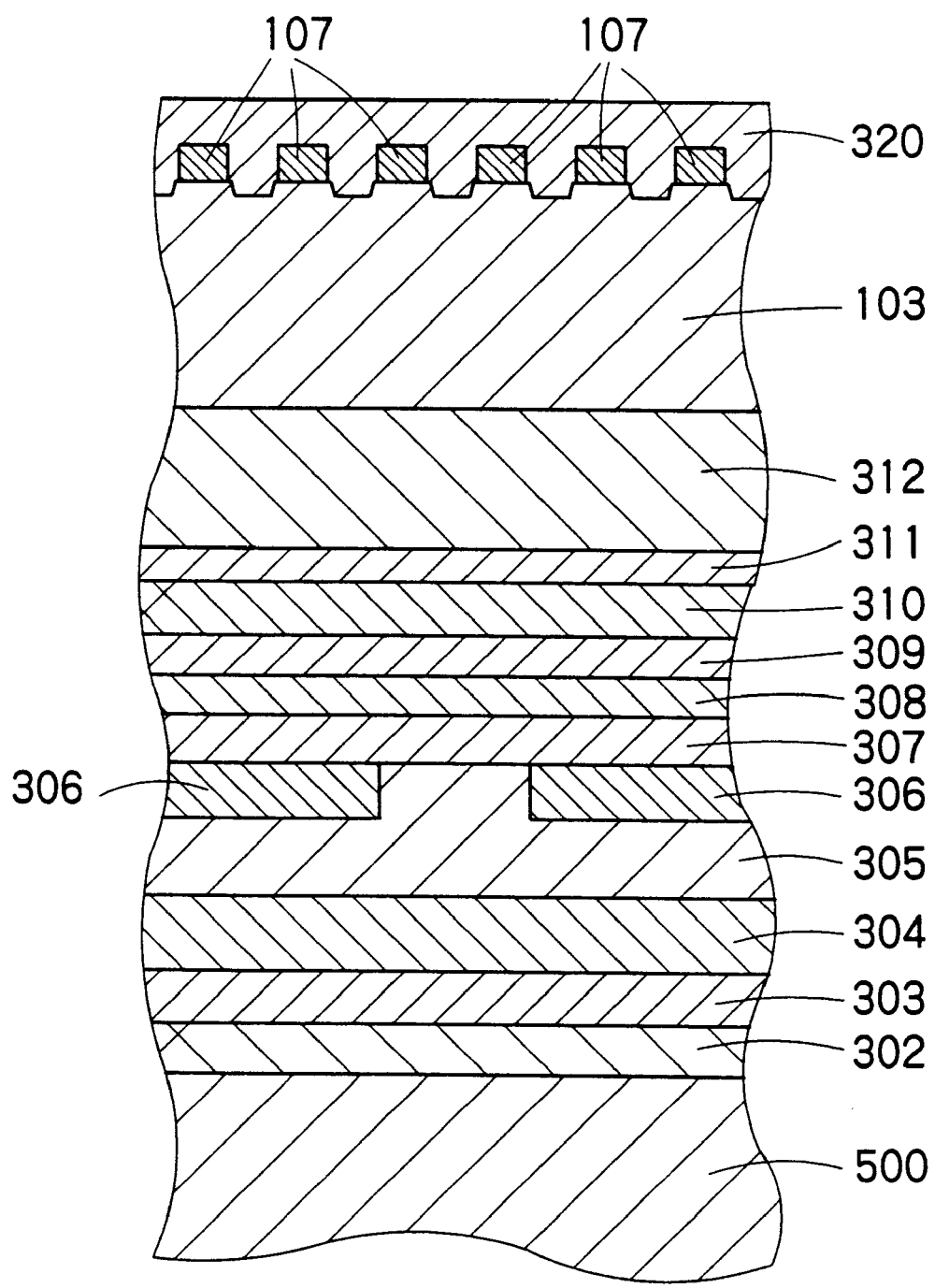
F I G. 9E

LASER BEAM

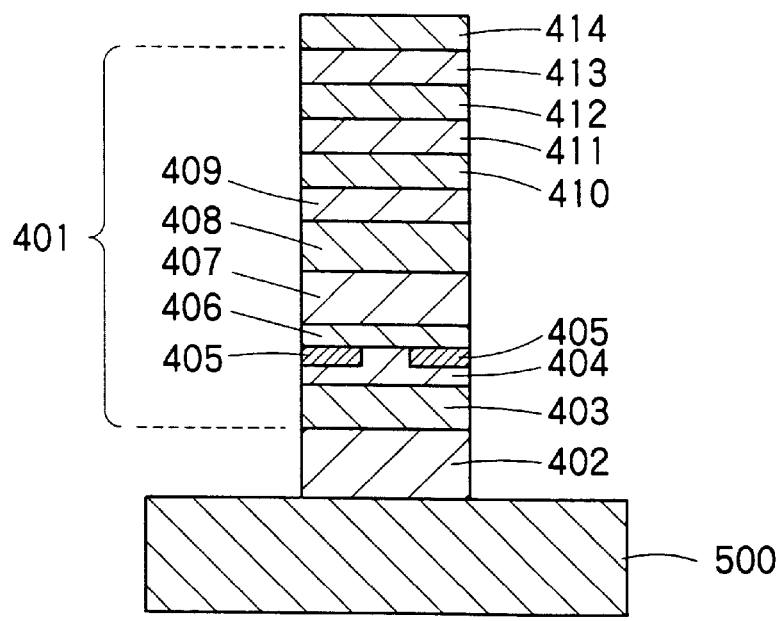
F I G. 12
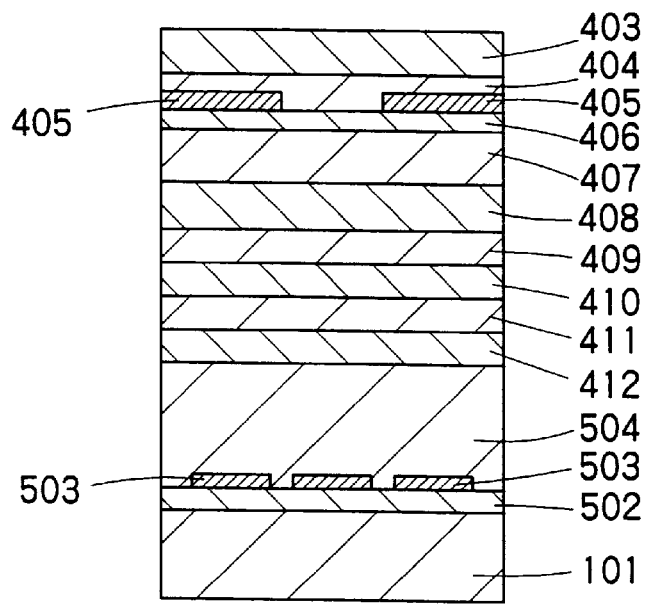
F I G. 13

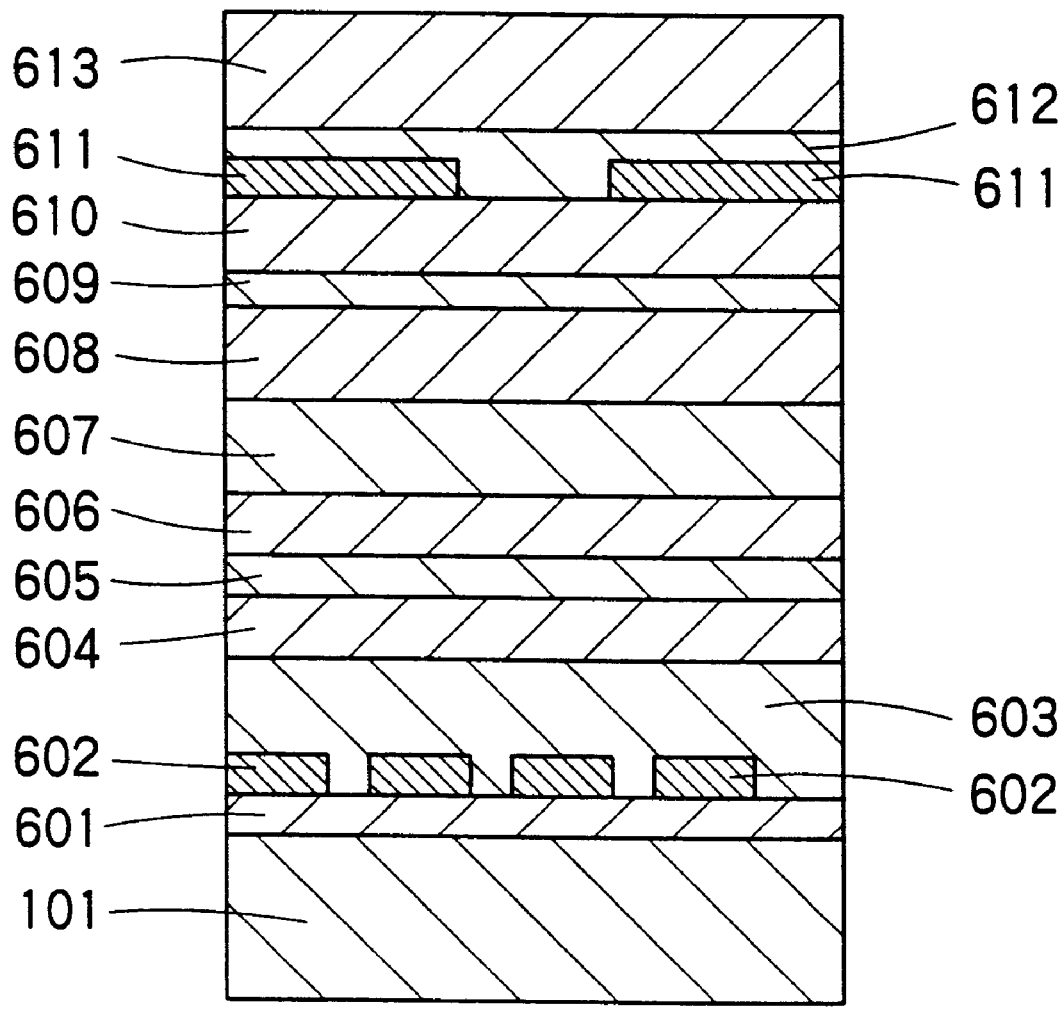
F I G. 14

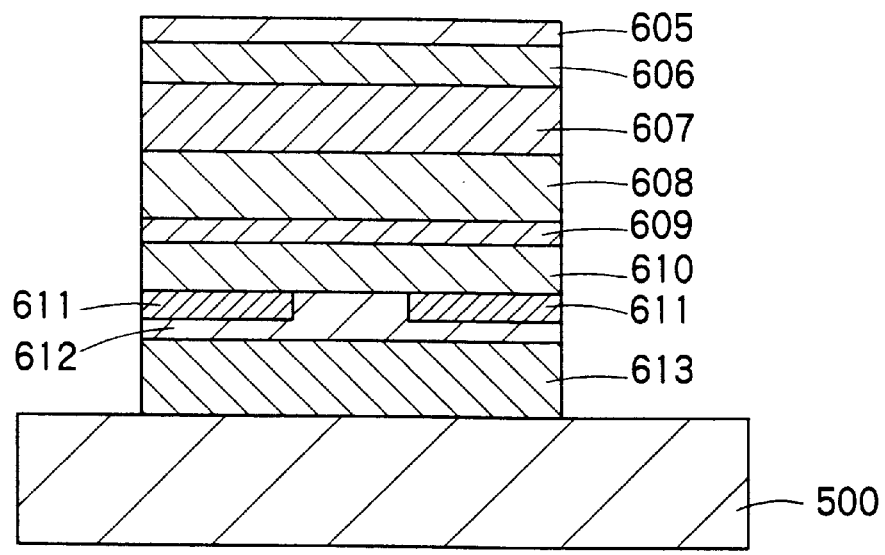
F I G. 15
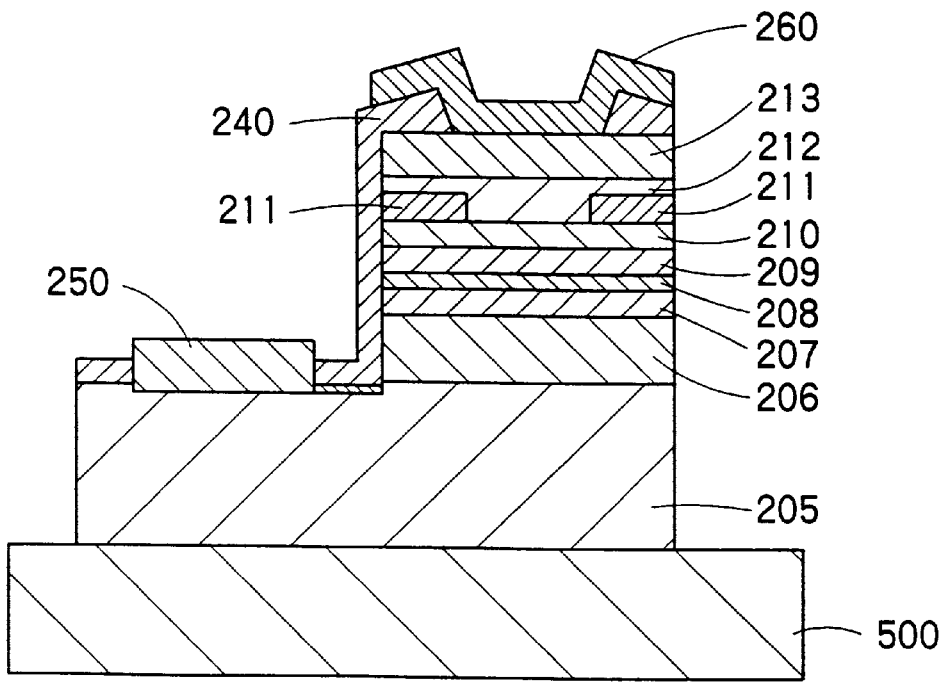
F I G. 16

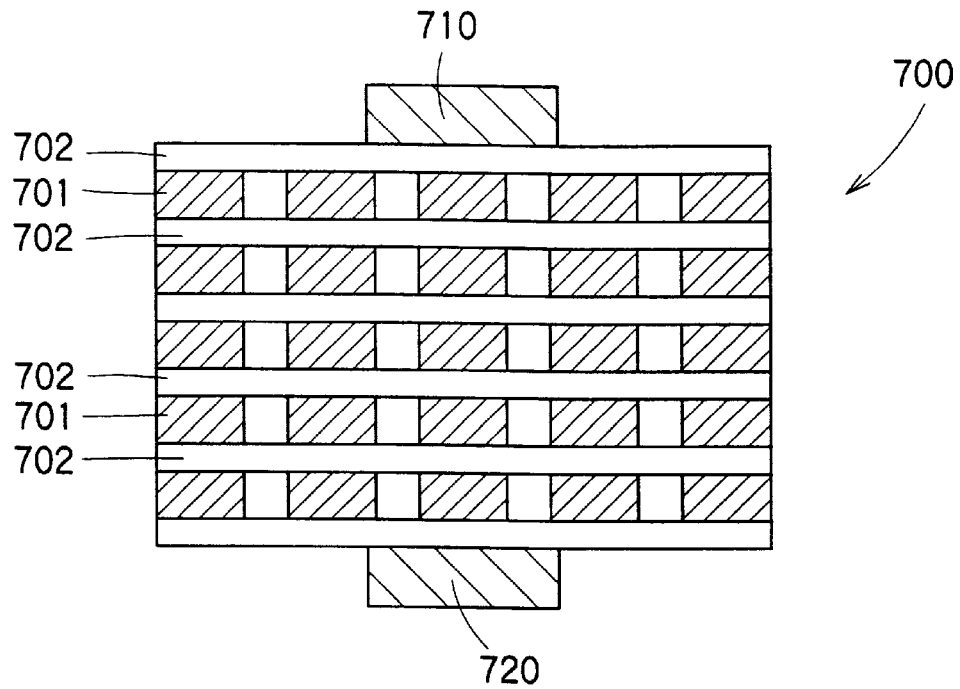
F I G. 17
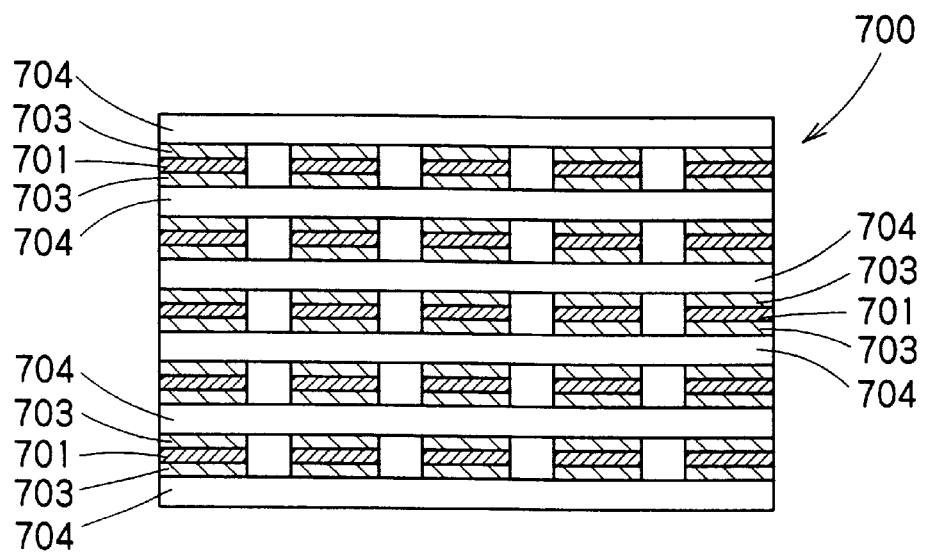
F I G. 18

SEMICONDUCTOR LIGHT EMITTING ELEMENT, AND ITS MANUFACTURING METHOD

BACKGROUND OF THE INVENTION

This invention relates to a semiconductor light emitting element, its manufacturing method and a semiconductor light emitting device. More particularly, the invention relates a semiconductor light emitting element made of nitride compound semiconductors with a high quality crystal obtained by easily and reliably dividing a sapphire substrate, its manufacturing method and a semiconductor light emitting device.

Recently, semiconductor light emitting elements such as light emitting diodes (LED) and semiconductor lasers have come to be used in various fields of household electric appliances, office automation appliances, communication devices, industrial measuring instruments, and so on. Particularly, short-wavelength semiconductor lasers are being under vigorous development toward the use in high-density optical disc recording which is expected to become useful in a lot of fields.

Red semiconductor lasers currently being used have been improved in recording density as compared with infrared semiconductor lasers used theretofore. Red semiconductor lasers are light emitting elements made of InGaAlP materials for the band of 600 nm and have already been brought into practical use, with properties improved to a level usable for both read and write operations of optical discs.

However, red semiconductor lasers using these materials involve a number of problems from the standpoint of their materials, such as difficulty in reducing crystal defects and high operation voltages, which should be overcome toward the use in the next-generation optical disc recording, for example. Additionally, their oscillation wavelengths are around 460 nm minimum, and it is difficult to realize oscillation in a wavelength in the order of 420 nm, which is required for the new systems, because of their physical properties.

On the other hand, blue semiconductor lasers are being developed toward higher recording densities. Heretofore, oscillating operations have been confirmed with semiconductor lasers using II-VI compound materials. However, there are many bars against their practical use, such as their reliability which cannot be ensured over 100 hours approximately. Additionally, there are many obstacles from the viewpoint of materials against their applications to the next-generation optical disc systems, etc., such as the difficulty to reduce their oscillation wavelength below 480 nm, for example.

In contrast, nitride compound semiconductor lasers containing GaN (gallium nitride) are basically available for short wavelengths below 350 nm, and actual oscillation in 400 nm has been reported. Also regarding the reliability, it has been confirmed that an LED maintained reliability beyond ten thousand hours. Laser oscillation at a room temperature has also been confirmed recently. As these facts demonstrate, nitride compound semiconductors are materials having excellent properties meeting the requirements for various ways of use thereof, such as light sources for next-generation optical disc recording, for example.

In the present application, "nitride compound semiconductors" include III-V compound semiconductors expressed by the chemical formula $B_x In_y Al_z Ga_{1-x-y-z}N$ ($0 \leq x \leq 1$, $0 \leq y \leq 1$, $0 \leq z \leq 1$), and group V elements include N and mixed crystals containing phosphorus (P) or arsenic (As) as well.

However, conventional light emitting elements using nitride compound semiconductors involve various problems explained below.

Conventional light emitting elements using nitride compound semiconductors, in general, were epitaxially grown on sapphire substrates. However, because of great differences in lattice constant between sapphire substrates and nitride compound semiconductors, a great deal of crystal defects are inevitably produced in growth crystals. These crystal defects essentially constitute an obstructive factor against improvements of various properties and lifetime of elements.

Additionally, since these elements are formed on insulating sapphire substrates, both the n-side electrode and the p-side electrode must be formed on the same side as the epitaxial growth layers. Therefore, the p-type layer, active layer and n-type layer are partly removed by etching, and the n-side electrode is formed on the n-type layer. In this structure, however, since the part actually operating as the element is formed on a thick sapphire substrate, cleavage for making cavity edges necessary for a laser is difficult.

In order to improve heat dissipation of an element, it is usual to bring the element into close contact with a heat sink. In this structure, however, even when putting the sapphire side in close contact with the heat sink, sufficient radiation of heat cannot be expected because of a low heat conductivity of the sapphire. If the electrode side is put in close contact with the heat sink, heat resistance certainly decreases. However, it is difficult to do so with the element locating the electrodes on the same side with respect to the substrate, and its production yield is bad.

Moreover, since the element has the sapphire substrate on the opposite side from the heat sink, its heat dissipation is still bad.

Furthermore, as far as the element includes the sapphire substrate, a current injected from the electrode must flow horizontally (in the lateral direction) in the element, and resistance of the element increases.

Additionally, since the geometrically shortest path between the p-side electrode and the n-side electrode is along the surface of the element, leak current becomes large.

SUMMARY OF THE INVENTION

It is therefore an object of the invention to provide a nitride compound semiconductor light emitting element excellent in cleavability, heat dissipation, anti-leakage, etc. by easily and reliably separating a sapphire substrate with a good reproducibility, and also relates to its manufacturing method and a semiconductor light emitting device using same.

To attain the object, the invention provides a method for epitaxially growing a nitride compound semiconductor layer on a substrate of sapphire, for example, and easily and reliably separating the substrate. The nitride compound semiconductor layer obtained by separating the substrate can be used as a new substrate to epitaxially grow a high-quality nitride compound semiconductor layer thereon.

By hydride chemical vapor epitaxy (H-CVE) using HCl (hydrochloric acid) as a transport carrier, it is fairly easy to grow a thick crystal layer of a nitride semiconductor. The inventors has noticed, however, that the crystal grown thereby contains a lot of crystal defects, since it uses a sapphire substrate as the growth substrate, and they constitute an obstructive factor against improvements of properties of the light emitting element made thereon.

On the other hand, the semiconductor layer grown by a lateral growth method employing local masks of quartz shows grain boundaries, defects and voids which are produced in portions grown on the quarts mask.

For the purpose of preventing the above-indicated various phenomena, it would be a good idea to grow GaN of approximately 100 μm on a sapphire substrate, then to remove the sapphire substrate and to use the resulting GaN layer as a substitute substrate. However, the lapping technique normally used for thinning the hard sapphire substrate are not satisfactory in throughput, and are liable to occur cracking or other troubles during the lapping process.

According to the invention, there is provided a method for manufacturing a semiconductor light emitting element, comprising the steps of: forming on a single crystal substrate an abruption mechanism susceptible to a stress; growing an epitaxial base layer of a nitride compound semiconductor on said abruption mechanism; growing an epitaxial light emitting layer of a nitride compound semiconductor on said epitaxial base layer; and separating said epitaxial base layer from said substrate by applying a stress to said abruption mechanism before or after said step of growing an epitaxial light emitting layer.

In rough classification, there are three different methods for separating the base layer from the substrate according to the invention, namely, a method using a "lift-off layer", a method for processing the surface of the substrate to make recesses, and a method for irradiating laser light from the bottom surface of the substrate.

That is, according to the invention, there is provided a manufacturing method for manufacturing a semiconductor light emitting element, comprising the steps of: forming a lift-off layer containing crystal defects or deficiencies on a substrate; forming a layer of a nitride compound semiconductor on the lift-off layer; and applying a stress to the lift-off layer and thereby separating the substrate and the layer of the nitride compound semiconductor. The crystal defects contained in the lift-off layer may involve dislocation, point defects, planar defects, and other various micro irregularities, and the "deficiencies" may involve cracks, voids, pits and other macro defects.

According to the invention, there is further provided a manufacturing method for manufacturing a semiconductor light emitting element, comprising the steps of: forming recesses along a surface of a substrate; forming a layer of a nitride compound semiconductor on the substrate to cover the recesses; and separating the substrate and the layer of the nitride compound semiconductor.

The step of separating the substrate and the layer is effected by changing the temperature.

Alternatively, the step of separating the substrate and the layer is effected by applying an ultrasonic wave.

According to the invention, there is further provided a semiconductor light emitting element comprising: a multi-layered structure stacking a plurality of nitride compound semiconductor layers; a first electrode provided at one end of the multi-layered structure; and a second electrode provided at the other end of the multi-layered structure, the multi-layered structure having a thickness not larger than 20 μm.

According to the invention, there is further provided a semiconductor light emitting device comprising: a semiconductor light emitting element including a multi-layered structure stacking a plurality of nitride compound semiconductor layers; a first electrode provided at one end of the multi-layered structure; and a second electrode provided at the other end of the multi-layered structure, and having a thickness not larger than 20 μm; and a heat sink coated with a metal, one of the first electrode and the second electrode of the semiconductor light emitting element being in direct contact with the metal coating the heat sink, interposing no metal of a low melting point therebetween.

According to the invention, there is further provided a manufacturing method for manufacturing a semiconductor light emitting device, comprising the steps of: providing on a substrate a first layer of a nitride compound semiconductor having a smaller band gap than a material forming the substrate; providing a second layer of a nitride compound semiconductor on the first layer; and irradiating laser light onto the substrate from its bottom surface to have the laser light absorbed into the first layer, and thereby separating the substrate and the second layer.

The invention is used in the above-explained modes, and promises various effects shown below.

Since the sapphire substrate can be separated easily and reliably, deterioration of the crystalline property due to lattice mismatching with the sapphire substrate can be overcome. As a result, crystals with much higher qualities than conventional ones can be obtained, and semiconductor light emitting elements can be improved in electric, optical properties and in lifetime.

By separating the sapphire substrate, the invention ensures easy and reliable cleavage for making laser facets. That is, facets more mirror-polished than those of conventional nitride compound semiconductor laser elements can be made successfully and reproducibly, and emission property of the laser can be improved significantly.

Additionally, although conventional elements made on sapphire substrates are made by forming a mesa and forming both the p-side electrode and the n-side electrode on a common side, the structure according to the embodiment of the invention decreases the leak current.

Moreover, since the finished element does not include the sapphire substrate which is different in thermal expansion coefficient from nitride compound semiconductors, distortion by heat generated during operation of the laser can be prevented, and the lifetime of the element is improved. Furthermore, since the embodiment is free from optical reflection occurring along the interface between the sapphire substrate and the GaN layer in a conventional element, the oscillation mode of the element is stabilized, and its threshold value decreases.

Furthermore, since separation of the substrate gives no substantial damage to the separated sapphire substrate, it can be used again for the next crystal growth. Therefore, the epitaxial crystal of nitride compound semiconductors with less defects and better quality can be manufactured in large quantities economically.

As explained above in detail, the invention can provide high-performance, highly reliable, inexpensive semiconductor light emitting devices, and it is greatly useful.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 1A through 1D are cross-sectional views showing a manufacturing method of a semiconductor light emitting element according to the first embodiment of the invention;

FIG. 2 is a cross-sectional view showing the part of a GaN layer 12, AlGaN layer 13 and GaN layer 14 in FIG. 1 in an enlarged scale;

FIG. 3 is a cross-sectional view showing a part of the semiconductor light emitting element using InGaN as a "lift-off layer";

FIG. 4 is a cross-sectional view schematically showing a semiconductor laser fabricated by the method according to the first embodiment;

FIG. 5 is a cross-sectional view schematically showing a light emitting diode fabricated by the same manufacturing method as used for the laser of FIG. 4;

FIGS. 6A through 6D are diagrams for explaining the second embodiment of the invention;

FIG. 7 is a cross-sectional view schematically showing the structure of a semiconductor laser manufactured by the second embodiment;

FIG. 8 is a cross-sectional view schematically showing another specific example of laser element manufactured by the second embodiment;

FIG. 9E is a cross-sectional view schematically showing a laser device manufactured by the manufacturing method according to the first modification of the second embodiment of the invention;

FIG. 12 is a cross-sectional view schematically showing a laser element manufactured by the third embodiment of the invention;

FIG. 13 is a cross-sectional view schematically showing the second specific example of the third embodiment;

FIG. 14 is a cross-sectional view schematically showing the third specific example of the third embodiment;

FIG. 15 is a cross-sectional view schematically showing a semiconductor laser device manufactured by the third embodiment;

FIG. 16 is a cross-sectional view schematically showing an example in which a p-side electrode and an n-side electrode are formed on a surface opposite from a heat sink 500;

FIG. 17 is a diagram schematically showing the structure of a stacked laser obtained by the present invention; and FIG. 18 is a diagram schematically showing a modification of the stacked laser according to the invention.

DETAILED DESCRIPTION OF THE PREFERRED EMBODIMENTS

Figure 9A:
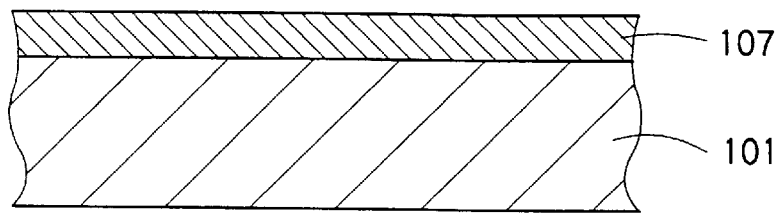
FIGS. 9A through 9D are cross-sectional views schematically showing the first modification of the second embodiment of the invention.

Explained below are embodiments of the invention with reference to the drawings.

First explained is a method for separating a substrate using a "lift-off layer" as the first embodiment of the invention.

FIGS. 1A through 1D are cross-sectional views showing different steps of a manufacturing method of a semiconductor light emitting element according to the first embodiment. That is, these figures illustrate a manufacturing method of a semiconductor laser using nitride semiconductors.

First referring to FIG. 1A, a GaN layer 12, AlGaN layer 13 and n-type GaN layer 14 are grown on a sapphire substrate 11 by MOCVD (metal organic chemical vapor deposition). A buffer layer, not shown, may be provided between the substrate 11 and the GaN layer 12. A normal pressure was used for growth of these layers. The layers other than the buffer layer, namely, GaN layers 12, 14 and AlGaN layer 13 were grown in an atmosphere basically mixing nitrogen, hydrogen and ammonium in a temperature range from 1000° C. to 1100° C.

The Al composition in the AlGaN layer 13 is approximately 30%, and it is formed thick so that cracks are produced over the entire surface of the grown layer. The AlGaN layer 13 having these defective parts is susceptible to a stress and functions as a "lift-off layer" for separating the substrate 11 as explained later.

Next referring to FIG. 1B, an n-type GaN layer 15 is grown to a thickness around 80 $\mu$m, and a multi-layered structure 16 including a double-heterostructure, etc. as an important part of the semiconductor laser is further grown on the layer 15. To grow the n-type GaN layer 15 to a thickness around 80 $\mu$m, it is desirable to use hydride VPE (vapor phase epitaxy) with a higher growth rate than MOCVD. For growth of the multi-layered structure 16, however, MOCVD may be used as used conventionally.

Next referring to FIG. 1C, the substrate 11 is separated. More specifically, after a mesa stripe portion of the semiconductor laser is formed by using photolithography, for example, the semi-product is bonded by wax, for example, onto a tool 17, orienting the multi-layered structure of the laser downward. Then, by applying a stress through fitting a tool onto a side surface or a bottom surface of the substrate 11 and frictionally moving the tool, the substrate 11 can be readily separated. Separation occurs near the front and back interface of the AlGaN layer 13 as the "lift-off layer" susceptible to a stress.

After the substrate 11 is separated, the p-side electrode 18 and the n-side electrode 19 are made as shown in FIG. 19. Then, the product is cleaved into chips with laser edges.

The multi-layered structure 16 of the laser may be made after the substrate 11 is separated. That is, after growing the n-type GaN layer 15 by hydride VPE, the substrate 11 may be separated as shown in FIG. 1C, and the n-type GaN layer 15 obtained thereby may be used as a new substrate to grow the multi-layered structure 16 and make the electrodes 18, 19.

In the embodiment shown here, the mechanism of separation of the substrate 11 can be explained as follows.

FIG. 2 is a cross-sectional view showing the part of the GaN layer 12, AlGaN layer 13 and GaN layer 14 in FIG. 1 in an enlarged scale. In this embodiment, cracks 20A are produced during growth of the AlGaN layer 13 due to a lattice distortion derived from Al (aluminum). Especially when the Al composition is 30% or more, the cracks 20A are produced in a high density. The Inventor confirmed through an experiment that cracks 20A are hexagonal in their plan view in most cases.

In this manner, when the wafer is held at the growth temperature after growth of the AlGaN layer 13, parts of the GaN layer 12 under the cracks 20A are etched by hydrogen contained in the growth atmosphere, and voids 20B are produced. When the n-type GaN layer 14 is grown thereon, portions above the cracks 20A are also buried continuously and flat because of two-dimensional growth occurring there, and no adverse affection is given to the layer grown thereon.

These cracks 20A and voids 20B, however, physically weaken the interfaces with the AlGaN 13 as the "lift-off layer". Therefore, when a stress is applied thereto as explained above, for example, The substrate 11 is separated starting from cracks 20A and voids 20B. In order to easily bring about separation of the substrate 11 in this embodiment, the Al composition of the AlGaN layer 13 as the "lift-off layer" is preferably in the range from 10% to 30%, and the thickness of the layer 13 is preferably in the range from 0.1 to 1 µm. If the Al composition is lower or the layer is thinner, the cracks will be too few to have the substrate 11 separated easily. If the Al composition is higher or the layer is thicker, the crystalline property of the nitride compound semiconductor layer grown thereon tends to deteriorate significantly.

In the method for applying a stress to separate the substrate, the stress may be applied by suddenly decreasing the temperature after growth of the multi-layered structure 16 instead of using a tool. Alternatively, the substrate can be separated also by making "scribed cuts" into the sapphire substrate 11 from its bottom surface by using a dicer, for example. Furthermore, it can be separated also by introducing the wafer into an ultrasonic cleaner. Moreover, as explained later in greater detail, the substrate can be separated by irradiating laser light of a wavelength in the ultraviolet range onto the sapphire substrate 11 from its bottom surface and thereby having the nitride compound semiconductor layer absorb the light. The laser light induces a dense local heat stress onto the lift-off layer and the nitride compound semiconductor layer vaporize with heat locally generated thereby.

The layer 13, i.e., the "lift-off layer" used in the embodiment for separating the substrate 11 may be made of any other appropriate material other than high-composition AlGaN, which produces a lattice distortion.

FIG. 3 is a fragmentary cross-sectional view of a structure using InGaN as the "lift-off layer". That is, in the structure shown here, an InGaN layer 21 is provided between the GaN layer 12 and the n-type GaN layer 14. The In (indium) composition in the InGaN layer 21 may be around 20%. When the InGaN layer 21 is inserted, pits 20C caused presumably by phase separation of In are produced in a high density during growth. These pits 20C are fine bores passing through the InGaN layer 21, and are distributed as dense as 107 pieces through 109 pieces per cm$^2$ in most cases. The pits makes the InGaN layer 21 physically fragile, and the substrate 11 can be separated easily.

In order to easily bring about separation of the substrate 11, the In composition in the InGaN layer 13 as the "lift-off layer" is preferably not less than 10%, and more preferably not less than 20%. However, if MOCVD is used, there is the tendency that the growth becomes difficult as the In composition increases. The thickness thereof is preferably in the range from 0.1 to 1 µm. If the In composition is lower or the layer is thinner, the pits will be too few to have the substrate 11 separated easily. If the In composition is higher or the layer is thicker, the crystalline property of the nitride compound semiconductor layer grown thereon tends to deteriorate significantly.

InGaN can be grown even by hydride VPE. Therefore, if the growth conditions are optimized, it may be grown on the sapphire substrate 11 directly from the GaN layer 12 by hydride VPE.

Usable as the "lift-off layer" in the embodiment are other layers including dislocation or other crystal defects in a much higher density than other portions, instead of those including spatial voids such as cracks or pits explained above. More specifically, any semiconductor layer having a density of defects not less than $10^8/cm^2$ and a thickness not less than 10 nm can be used as the "lift-off layer". Any of the above-mentioned lift-off layers may be formed directly on the sapphire substrate.

Instead of making the lift-off layer by crystal growth, it is possible to use a method of patterning a dielectric film such as $SiO_2$ on the GaN layer 12 into stripes, thereby accelerating the lateral growth mode during growth by MOCVD or hydride VPE and terminating upward dislocation. In this case, the portion of the $SiO_2$ layer can be used as the "lift-off layer" of the substrate. In this case, $SiO_2$ may be processed by side etching using hydrofluoric acid, for example, after growth to make voids additionally.

FIG. 4 is a cross-sectional view schematically showing a semiconductor laser fabricated by the embodiment explained above. Reference numeral 15 denotes an n-type GaN contact layer (Si-doped by the doping concentration of $1 \times 10^{18}$ cm$^{-3}$) grown by hydride VPE, and it is used as a new substrate by first growing on a sapphire substrate 11 and thereafter separating it from the sapphire substrate, as already explained with reference to FIG. 1C. Numeral 24 refers to an n-type $Al_{0.08}Ga_{0.92}N$ cladding layer (Si-doped by $1 \times 10^{18}$ cm$^{-3}$ and 0.8 µm thick), 25 to a GaN optical guide layer, 26 to an active layer portion having a multi-quantum structure (MQW), and 27 to a GaN optical guide layer (Mg-doped by $1 \times 10^{19}$ cm$^{-3}$ and 0.1 µm thick).

Each well layer in MQW of the active layer portion 26 is a 3 nm thick $In_{0.15}Ga_{0.85}N$ layer, and each barrier layer is made of 6 nm thick $In_{0.02}Ga_{0.98}N$. The well layers are in five. The active layer portion 26 includes a 2 nm thick p-type $Al_{0.20}Ga_{0.80}N$ cap layer between MQW and the p-type optical guide layer 27.

Still referring to FIG. 4, reference numeral 28 denotes a p-type $Al_{0.08}Ga_{0.92}N$ cladding layer (Mg-doped by $5 \times 10^{19}$ cm$^{-3}$ and 0.8 µm thick). Numeral 30 denotes a p-type GaN contact layer (Mg-doped by $8 \times 10^{19}$ cm$^{-3}$ and 0.5 µm thick), and its uppermost portion is increased in Mg concentration to $2 \times 10^{20}$ cm$^{-3}$. Numeral 29 denotes a current blocking layer made of n-type InGaN, 31 denotes a p-side electrode made of stacked Pt/Ti/Pt/Au in this order, and 32 denotes an n-side electrode. The laser mirror extending in parallel with the drawing sheet is made by cleavage.

The laser shown in FIG. 4 is as already explained with reference to FIGS. 1A through 1D. That is, the n-type GaN layer 15 is stacked on the sapphire substrate, not shown, via the lift-off layer by crystal growth using hydride VPE (H-VPE). Then, the n-type GaN layer 15 obtained by separating the sapphire substrate from the portion of the lift-off layer is used as the substrate to grow layers 24 through 30 by MOCVD. Alternatively, the sapphire substrate may be separated after the layers 15 through 30 are grown on the sapphire substrate via the lift-off layer.

The ridge structure using the current blocking layer 29 can be made by combining an optical lithographic technique using a photo resist, and a dry etching technique using reactive chlorine-based ions. That is, the current blocking layer 29 is grown by using a selective re-growth technique, and the contact layer 30 is grown on it.

According to the embodiment, since the sapphire substrate can be separated, layers first grown by using the sapphire substrate can be cleaved easily and reliably to make laser facets. That is, mirror-polished faces can be made more stably than conventional nitride compound semiconductor laser elements, and the laser oscillation property can be improved largely.

Additionally, although conventional elements made on sapphire substrates are made by forming a mesa and forming both the p-side electrode and the n-side electrode on a common side, the structure according to the embodiment of the invention decreases the leak current.

Moreover, since the finished element does not include the sapphire substrate which is different in thermal expansion coefficient from nitride compound semiconductors, distortion by heat generated during operation of the laser can be prevented, and the lifetime of the element is improved. Furthermore, since the embodiment is free from optical reflection occurring along the interface between the sapphire substrate and the GaN layer in a conventional element, the oscillation mode of the element is stabilized, and its threshold value decreases.

For example, according to the embodiment, when the ridge width was 4 μm on the bottom surface, the element continuously oscillated under the threshold value of 65 mA at a room temperature. As a result of measurement on an element with the p-side electrode 31 being mounted on a heat sink, its oscillation wavelength was 405 nm, and the operation voltage was approximately 4.5 V. The beam property was single-peaked, and the astigmatism was as sufficiently small as 10 μm. The maximum optical output reached 10 mW during continuous oscillation, and the maximum continuous oscillation temperature was 60° C. Regarding its reliability, the element stably operated over 1000 hours at a room temperature. That is, the embodiment can manufacture a semiconductor light emitting element having a very high performance and a high reliability by easily and reliably separating epitaxially grown layers from the sapphire substrate 11.

Besides, the sapphire substrate 11 separated from the grown layers can be re-used for the next crystal growth since it has no essential damage by the separating process. Accordingly, the epitaxially grown nitride compound layers with an excellent quality can be supplied with a drastically lower cost.

This embodiment is also applicable to fabrication of light emitting diodes.

FIG. 5 is a cross-sectional view schematically showing a light emitting diode fabricated by the same method as used for the laser shown in FIG. 4. In FIG. 5, reference numeral 15 denotes an n-type GaN contact layer (Si-doped by $1\times10^{18}$ cm$^{-3}$) made by hydride VPE, 34 denotes an n-type Al$_{0.08}$Ga$_{0.92}$N cladding layer (Si-doped by $1\times10^{18}$ cm$^{-3}$ and 0.3 μm thick), 35 denotes an active layer of a multi-quantum well structure (MQW), and 11 denotes the removed sapphire substrate. Each well layer in MQW is a 3 nm thick In$_{0.35}$Ga$_{0.65}$N layer, and each barrier layer is made of 6 nm thick In$_{0.02}$Ga$_{0.98}$N. The well layers are in three.

Numeral 36 denotes a Al$_{0.08}$Ga$_{0.92}$N cladding layer (Mg-doped by $5\times10^{19}$ cm$^{-3}$ and 0.1 μm thick). Numeral 37 denotes a p-type GaN contact layer (Mg-doped by $8\times10^{19}$ cm$^{-3}$, and its uppermost portion is increased in Mg concentration to $2\times10^{20}$ cm$^{-3}$. Numeral 38 denotes a p-side electrode made of Pt/Ti/Pt/Au, 39 is an n-side electrode, and 40 is a chip carrier.

In this example, the p-side electrode 38 is used as an optical reflection layer, and a full-area contact can be made. Therefore, the external quantum efficiency is improved and the operation voltage is reduced. Additionally, since the p-side electrode and the n-side electrode can be made on the top and on the bottom of the chip, respectively, the chip size can be reduced than the conventional nitride compound LED made on a sapphire substrate.

With this example, the current value of 20 mA wad obtained under the applied voltage of 2.8 V, and optical output of 10 mW was obtained in the blue wavelength band of 450 nm.

Next explained is the second embodiment of the invention configured to easily and reliably separate the substrate by previously processing the surface of the substrate of sapphire, for example, and thereafter epitaxially growing nitride semiconductor layers.

FIGS. 6A through 6D are schematic diagrams for explaining the second embodiment of the invention. That is, FIGS. 6A through 6D are cross-sectional views of the substrate portion under different steps of a manufacturing process. Numeral 101 refers to a sapphire substrate, 102 to voids, 103 to a GaN epitaxial layer, and 104 to poly-crystallized GaN.

In this embodiment, first referring to FIG. 6A, recesses are made on the surface of the sapphire substrate 101. More specifically, a mask, not shown, is applied onto the sapphire substrate 101, and grooves, 2 μm wide and 3 μm deep, are made on the sapphire substrate 101 by dry etching. These grooves function as the abruption mechanism susceptible to a stress.

After removing the mask, as shown in FIG. 6B, the GaN layer 103 is epitaxially grown by hydride VPE. Using metal gallium as the source material of gallium (Ga), ammonia as the source material of nitrogen (N) and hydrogen chloride (HCl) as the transport carrier of gallium, setting the crystal growth temperature at approximately 950° C., and continuing crystal growth for eight hours, the GaN layer 103 can be epitaxially grown up to a thickness around 100 μm. The epitaxial growth results in covering the recesses in the substrate 101 and in making voids 102. In this process, polycrystalline GaN 104 accumulates on bottoms of the voids 102 in the substrate 101.

When the temperature is decreased to a room temperature after the epitaxial growth, the substrate 101 separates from the GaN layer 103 epitaxially grown thereon, as shown in FIG. 6C. Presumably, it occurs because cracks are produced between the substrate 101 and the GaN layer 103 while the temperature elevates, due to a distortion caused by a difference in thermal contraction coefficient. According to the embodiment, by providing voids 102, generation of such cracks is promoted, and the substrate 101 can be separated easily and reliably.

To separate the substrate 101, any method for applying a thermal or mechanical impulse can be also used in lieu of the method for cooling the substrate from the epitaxial growth temperature. For example, in the case where the substrate 101 does not come off even when cooled to a room temperature after epitaxial growth, by rapidly heating or cooling the substrate using RTA (rapid thermal annealing), cracks can be produced between the substrate 101 and the GaN layer 103 to facilitate separation of the substrate 101. Alternatively, by irradiating laser light of a wavelength absorbed by GaN with a high absorptance onto the substrate 101 from its bottom surface, GaN near the interface is exposed with a dense heat stress and can be vaporized, and the substrate can be separated. Easy and reliable separation of the substrate is ensured also by applying a mechanical stress or impulse by using various tools or ultrasonic waves.

The GaN layer 103, approximately 100 μm thick, obtained in this manner exhibited a mirror-polished surface and an n-type conductivity, and its carrier concentration was approximately $10^{17}$ cm$^{-3}$. The carrier concentration can be controlled by doping upon the epitaxial growth. Additionally, the GaN layer 103, approximately 100 μm thick, obtained in this manner was etched in molten potassium hydroxide at approximately 350° C. As a result, its etch pits were on the order of $10^6$ cm$^{-2}$. As compared with the etch pit density of approximately $10^8$ cm$^{-2}$ in a GaN layer as grown on a flat sapphire substrate, a great improvement has certainly been attained by the embodiment.

Next referring to FIG. 6D, using the GaN layer with a low defect density obtained in this manner as a substrate, a predetermined element structure 106 is epitaxially grown. If necessary, electrodes and a protective film are made as well.

In the case where the substrate 101 does not come off even when cooled to a room temperature after epitaxial growth of the GaN layer 103 by hydride VPE as shown in FIG. 6B, the wafer may be directly introduced into a MOCVD apparatus to grow the element structure 106. By applying a thermal or mechanical impulse later by the above-explained method, the sapphire substrate 101 can be separated easily and reliably.

Also in this embodiment, since separation of the substrate gives no substantial damage to the separated sapphire substrate, it can be used again for the next crystal growth. Therefore, the epitaxial crystal of nitride compound semiconductors with less defects and better quality can be manufactured in large quantities economically.

In the embodiment shown here, recesses formed on the surface of he sapphire substrate 101 need not be the grooves as shown in FIG. 6A but may be of any other configurations. It is sufficient for the recesses to be covered by the GaN layer 103 grown thereon and to produce cracks which easily bring about separation of the substrate. Other than a plurality parallel grooves, they may be a plurality of crossing grooves or a number of independent bores as well. The opening configuration of these bores may be circular, oval, polygonal or any other configurations including irregular ones.

The Inventor actually made some samples and has confirmed a tendency toward good results when $A \leq C$ and $A \leq B$ are established between the width A of each recess formed on the surface of the sapphire substrate 101, its depth B and distance C between every two adjacent recesses. That is, under these conditions, cracks are readily produced, and the GaN layer 103 can cover the recesses.

FIG. 7 is a cross-sectional view showing the structure of a semiconductor laser device manufactured by using this embodiment. In FIG. 7, the GaN layer 103 to be used as a substrate is shown on the top. Reference numeral 206 denotes an n-type cladding layer (0.8 μm thick layer including a GaN layer, undoped and 40 nm thick, and an AlGaN layer, Si-doped by $3\sim5\times10^{18}$ cm$^{-3}$ and 40 nm thick). Numeral 207 denotes a GaN light confinement layer (undoped and 0.1 μm thick), and 208 denotes an In$_{0.2}$Ga$_{0.8}$N/GaN-MQW active layer (undoped and including three cycles of 2 nm thick well layers and 4 nm thick barrier layers). Numeral 209 denotes a GaN light confinement layer (undoped and 0.1 μm thick. Numeral 210 refers to a first p-type Al$_{0.03}$Ga$_{0.97}$N cladding layer (Mg-doped by $1\times10^{18}$ cm$^{-3}$, Si-doped by $1\times10^{17}$ cm$^{-3}$ and 0.1 μm thick), 211 to an n-type Al$_{0.03}$Ga$_{0.97}$N current blocking layer (Si-doped by $1\times10^{18}$ cm$^{-3}$, Si-doped by $1\times10^{17}$ cm$^{-3}$ and 0.1 μm thick), 212 to a second p-type Al$_{0.03}$Ga$_{0.97}$N cladding layer (Mg-doped by $1\times10^{18}$ cm$^{-3}$, Si-doped by $1\times10^{17}$ cm$^{-3}$ and 0.1 μm thick) , and 213 to a p-type GaN contact layer.

In a specific growth procedure, layers from the cladding layers 206 to the current blocking layer 211 are first grown on the GaN layer 103. Thereafter, the wafer is removed from the growth chamber, and selectively etched in portions for a current to flow, until exposing the cladding layer 210. After that, the wafer is returned to the growth chamber, and the second cladding layer 212 and the contact layer 213 are grown thereon. For the serial growth of the laser element structure 106, MOCVD may be used.

The wafer having layers grown thereon are provided with electrodes, not shown, and then cleaved into chips. By mounting the chip on a heat sink 300, the laser device is completed. The laser device obtained in this manner has its n-side electrode on the top side of the chip and its p-side electrode on the bottom side of the chip.

The semiconductor light emitting device manufactured by the present invention has a very good crystalline property, and is greatly improved in electric-optical characteristics as compared with conventional light emitting elements made on sapphire substrates. Moreover, similarly to the first embodiment explained before, since both the p-side electrode and the n-side electrode can be made on and under the element, respectively, an increase of the contact area, reduction of the element resistance and a decrease of the chip size are ensured here again.

Additionally, since a current can be applied to flow vertically of the chip, defects in the element are educed remarkably, the reliability of the laser is improved significantly. As a result of a reliability test, favorable data permitting expectation of a lifetime over 100 thousand hours under the conditions of a room temperature and 50 mW.

FIG. 8 is a cross-sectional view schematically showing a semiconductor laser device as a second example, which is manufactured by the instant embodiment. In FIG. 8, the same reference numerals are attached to common components, and detailed explanation thereof is omitted. The laser device shown in FIG. 8, the p-side electrode 260 and the n-side electrode 250 are formed on a surface opposite from the heat sink 300.

For manufacturing the element of this type, the process up to step of making the element structure 106 may be the same as the process explained with reference to FIG. 7. Thereafter, however, it needs etching for making the n-side electrode 250. That is, the p-side electrode 260 is first made by patterning. After that, masking the portion for the p-side electrode 260 by SiO$_2$, for example, the other portion is selectively etched by dry etching to expose the n-type GaN layer 103. After removing this SiO$_2$, a SiO$_2$ current leak preventing film 240 is provided to cover the entire surface excluding the portion for the n-side electrode and the p-side electrode. Finally, the n-side electrode 250 is formed.

Since the laser device shown in FIG. 8 does not include a sapphire substrate between the heat sink and the active layer, unlike the conventional device, heat is radiated efficiently, and the heat characteristics of the laser, its lifetime and light emitting efficiency have been improved significantly.

Next explained is a modification of this embodiment.

FIGS. 9A through 9D are cross-sectional views schematically showing steps in the modification of the second embodiment of the invention. In this example, first as shown in FIG. 9A, a GaN layer 107 is grown on the sapphire substrate 101 by hydride VPE up to a thickness around 1 μm.

Figure 9B:
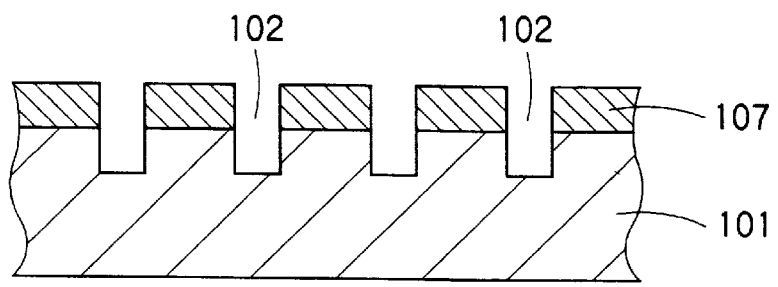

Next as shown in FIG. 9B, grooves are made. More specifically, making a mask, not shown, and using dry etching, etching of the width 2 μm and the depth 3 μm, for example, is executed to form grooves 102. These grooves 102 function as the abruption mechanism susceptible to a stress.

Figure 9C:
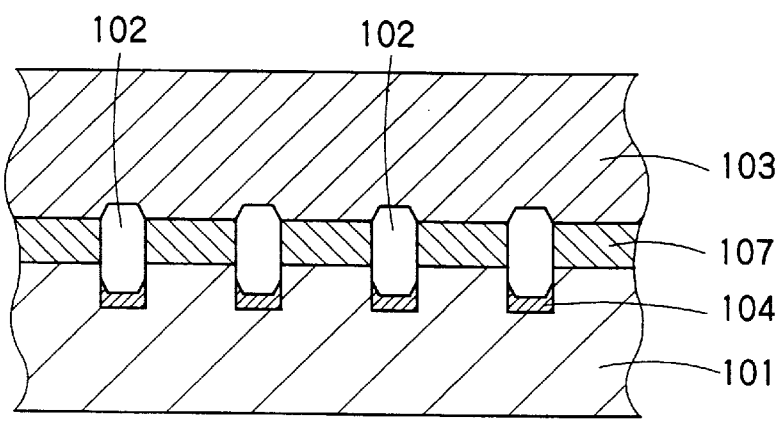

Next as shown in FIG. 9C, the GaN layer is grown. More specifically, the wafer is again introduced into the hydride growth apparatus, the GaN layer 103 is grown up to a thickness around 100 μm. In this process, the previously grown GaN layer 107 serves as the crystal core of the epitaxial growth, and the grooves 102 are reliably covered.

Figure 9D:
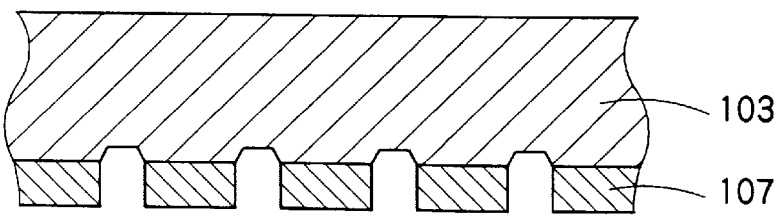

Thereafter, by cooling the wafer to a room temperature, the sapphire substrate 101 can be separated as shown in FIG. 9D. After that, the stacked structure of the GaN layers 103 and 107 is introduced into a MOCVD apparatus as a new substrate to grow a predetermined element structure thereon.

In the case where the sapphire substrate 101 does not come off after the growth of the GaN layer 103, the wafer may be directly introduced into the MOCVD apparatus so that, after growing the predetermined element structure, a stress be applied by applying a thermal or mechanical load to separate the sapphire substrate 101.

This example also attains the same various effects as explained with reference to FIGS. 6A through 8. Additionally, since this example is configured to previously grow the GaN layer 107 on the sapphire substrate 101, it makes the growth of the GaN layer 103 thereon easier, stably covers the grooves 102, and further improves the crystalline property of the element structure grown thereon.

FIG. 9E is a cross-sectional view schematically showing a laser device manufactured by the manufacturing method according to the first modification of the embodiment.

In FIG. 9E, reference numeral 302 denotes a p-side electrode, 303 is a p-type GaN contact layer (Mg-doped by $3\sim5\times10^{19}$ cm$^{-3}$ and 0.1 $\mu$m thick), 304 is an n-type GaN layer, 305 is a first AlGaN cladding layer (Mg-doped by $3\sim5\times10^{18}$ cm$^{-3}$ and 0.7 $\mu$m thick), 306 is an AlGaN current blocking layer (Si-doped by $3\sim5\times10^{18}$ cm$^{-3}$ and 0.2 $\mu$m thick), 307 is a second AlGaN cladding layer (Mg-doped by $3\sim5\times10^{18}$ cm$^{-3}$ and 0.1 $\mu$m thick), 308 is an AlGaN overflow preventing layer, 309 is a GaN guide layer (undoped and 0.1 $\mu$m thick), 310 is a MQW (three cycles of $In_{0.2}Ga_{0.8}N/In_{0.03}Ga_{0.97}N$) active layer, 311 is a GaN guide layer (Si-doped by $5\times10^{18}$ cm$^{-3}$ and 0.1 $\mu$thick), 312 is an n-type AlGaN cladding layer (Si-doped by $3\sim5\times10^{18}$ cm$^{-3}$ and 0.8 $\mu$m thick), 103 is an n-type GaN layer, 107 is an n-type GaN contact layer (Si-doped by $3\sim5\times10^{18}$ cm$^{-3}$ and 0.01 $\mu$m thick), and 320 is an n-side electrode. Numeral 500 denotes a heat sink.

This laser element can be manufactured by epitaxially growing the layers 312–303 on the GaN substrate layers 103 and 107 obtained by the process shown in FIGS. 9A–9D.

More specifically, first the GaN layers 103 and 107 are grown on a sapphire substrate with recesses as shown in FIGS. 9A–9C. Then the layers 103 and 107 are separated from the sapphire substrate 101. The obtained layers 103 and 107 are introduced into the MOCVD chamber and the layers 312 through 306 are grown in this sequence as shown in the FIG. 9E. After that, the wafer is moved out of the growth chamber of the MOCVD apparatus. Then, a mask is formed on a part of the current blocking layer 306, and the wafer is selectively removed by etching until exposing the cladding layer 307. Thereafter, the portion for a current to flow through is formed, and the cladding layer 305 through the contact layer 303 are grown subsequently by MOCVD.

In the case where the substrate 101 does not come off even when cooled to a room temperature after epitaxial growth of the GaN layer 103 by hydride VPE as shown in FIG. 9D, the wafer may be directly introduced into a MOCVD apparatus to grow the element structure 312 through 303. By applying a thermal or mechanical impulse later by the above-explained method, the sapphire substrate 101 can be separated easily and reliably.

Electrodes 302 and 320 are formed on the top and bottom surfaces of the element structure obtained, and the layered structure is cleaved into laser chips. Since the n-type contact layer 107 has many recesses on its surface as shown in FIG. 9E, the electrode 320 and the GaN layer 107 make an alloy more easily, and it is advantageous in decreasing the contact resistance than conventional ones.

After that, the p-side electrode 302 is bonded to the heat sink 500. For bonding the p-side electrode and the metal heat sink, it is desirable to process their surfaces in a high vacuum by plasma of hydrogen or argon, for example. In this case, the surface of the heat sink is preferably coated with copper (Cu), aluminum (Al) or an alloy of one of them. When they are bonded under these conditions, it is possible to overcome the problem of leakage of current caused by a creep-up part of the metal, which has been a problem accompanying the use of a metal solder with a low melting point, such as In (indium), gallium (Ga), tin (Sn) or lead (Pb).

A laser device manufactured through these processes was actually operated. As a result, it continuously oscillated with the threshold value 65 mA at a room temperature. The oscillation wavelength was 410 nm, and operation voltage was 3.0 V. Additionally, it was mounted on a heat sink without interposing a sapphire substrate. As a result, the heat dissipation property of the laser was improved by five times as compared with conventional ones. Since the cavity edges can be made reliably by cleavage, the facet reflectance is high. Also when a high reflectance coat is provided, the surface is less coarse, and a high reflectance is obtained easily. These effects contribute to improvements of various characteristics including the threshold value.

Additionally, although conventional elements made on sapphire substrates are made by forming a mesa and forming both the p-side electrode and the n-side electrode on a common side, the structure according to the embodiment of the invention decreases the leak current.

Moreover, since the finished element does not include the sapphire substrate which is different in thermal expansion coefficient from nitride compound semiconductors, distortion by heat generated during operation of the laser can be prevented, and the lifetime of the element is improved. Furthermore, since the embodiment is free from optical reflection occurring along the interface between the sapphire substrate and the GaN layer in a conventional element, the oscillation mode of the element is stabilized, and its threshold value decreases.

Furthermore, the instant embodiment also contributes to a remarkable reduction of the manufacturing cost by re-using the separated sapphire substrate.

Next explained is the second modification of the instant embodiment.

Figure 10A:
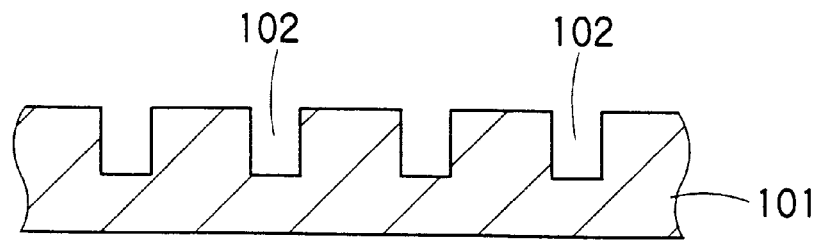
FIGS. 10A through 10D are cross-sectional views schematically showing the second modification of the second embodiment of the invention.

FIGS. 10A through 10D are cross-sectional views schematically showing steps in the second modification of the second embodiment of the invention. In this example, first as shown in FIG. 10A, grooves 102 are made on the sapphire substrate 101. More specifically, 20 $\mu$m wide, 40 $\mu$m deep grooves, for example, are made on the sapphire substrate in intervals of 40 $\mu$m by a dicing cutter. These grooves 102 function as the abruption mechanism.

Figure 10B:
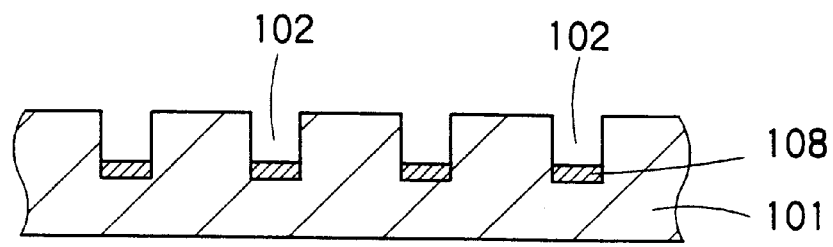

Next as shown in FIG. 10B, a mask layer 108 is deposited on the bottom of each groove. More specifically, after making the entire surface excluding the grooves 102, $SiO_2$ or other appropriate material is deposited to obtain the mask layer 108 on the bottom of each groove. In this case, thickness of $SiO_2$ as the mask layer 108 may be within 20 $\mu$m, which is the depth of the groove in sapphire, namely, 1 $\mu$m, for example.

Figure 10C:
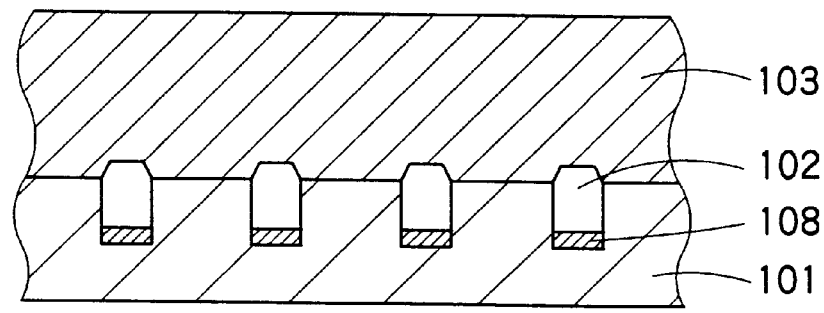
Figure 10D:
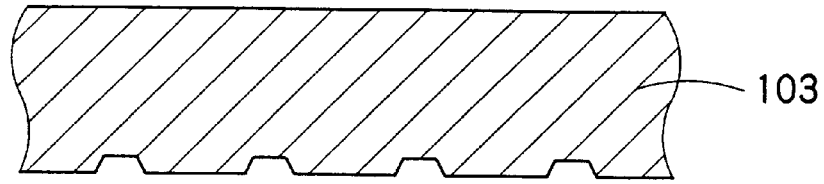

Next, as shown in FIG. 10C, the GaN layer 103 is grown. More specifically, the wafer is again introduced into the hydride growth apparatus, and the GaN layer 103 is grown up to a thickness around 100 µm. In this process, since the mask layer 108 exists on bottoms of the grooves 102, abnormal growth of GaN can be prevented. That is, distortion caused by dicing processing, for example, is liable to remain on bottoms of the grooves 102 of the sapphire substrate. This distortion may cause abnormal growth of GaN grown thereon, and this may invite the phenomenon that the GaN layer 103 cannot cover the grooves 102 successfully, and the element structure grown thereon deteriorate in crystalline property.

By providing the mask layer 108 of $SiO_2$, for example, on bottoms of the grooves 102, this modified example successfully prevents abnormal growth of GaN, and ensures good crystalline qualities of nitride compound semiconductors epitaxially grown thereon.

Using this modified example, the GaN layer 103 of a thickness around 100 µm was actually grown. As a result, its surface exhibited a mirror-polished smooth plane, and no apparent surface pattern of bores (pits) was found even through an optical microscope. Additionally, when wafers having the GaN layer 103 grown thereon were removed from the hydride growth apparatus, almost all wafers were separated from the sapphire substrates. When some wafers having failed to separate were washed in pure water by supersonic cleaning, their sapphire substrate 101 separated within five minutes approximately.

Additionally, the same laser elements as those of FIGS. 7 and 8 were actually made on the GaN layer 103 thus obtained. As a result, substantially the same characteristics were confirmed. On the other hand, using separated sapphire substrates after ordinary primary processing, the GaN layer 103 was again grown thereon. As a result, the GaN layer 103 exhibited a high quality crystal equivalent to the GaN layer 103 obtained before.

In this manner, the instant modified example also ensures easy and reliable separation of the sapphire substrate and promises the GaN layer having a very good crystalline property. Additionally, the embodiment can repeatedly use the sapphire substrate which takes a large part of the manufacturing cost of semiconductor elements made of nitride compound semiconductors, and thereby contributes to a remarkable reduction of the cost.

Next explained is the third embodiment of the invention.

Figure 11A:
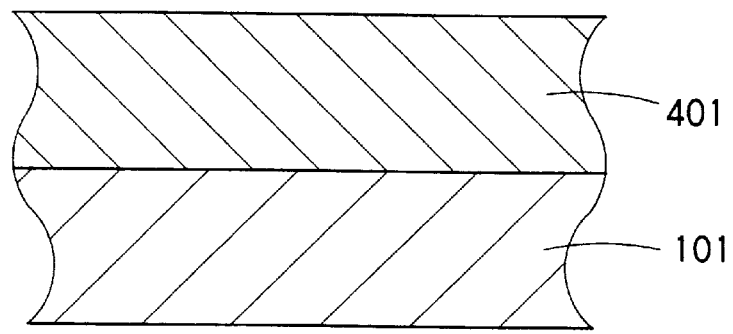
FIGS. 11A through 11C are fragmentary cross-sectional views schematically showing the third embodiment of the invention.
Figure 11B:
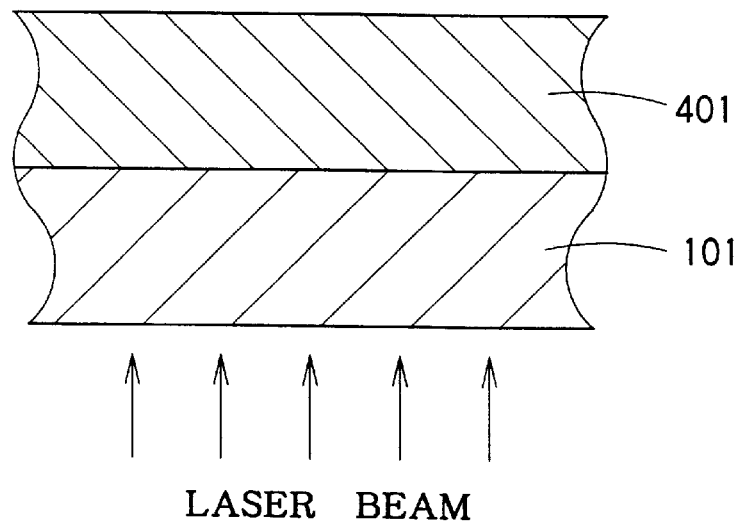
Figure 11C:
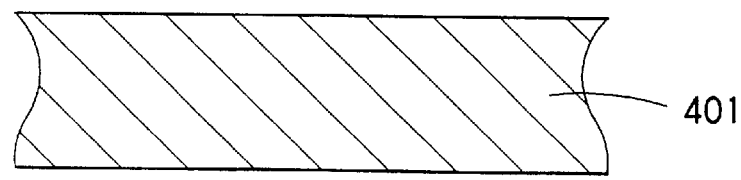

FIGS. 11A through 11C are fragmentary cross-sectional views showing steps of the manufacturing process according to the third embodiment. FIG. 12 is a cross-sectional view schematically showing a laser device manufactured by the manufacturing method according to the embodiment.

First explained is the structure of the laser device shown in FIG. 12. Reference numeral 402 denotes a p-side electrode, 403 is a p-type GaN contact layer (Mg-doped by $3\sim5\times10^{19}$ cm$^{-3}$ and 0.1 µm thick), 404 is a first AlGaN cladding layer (Mg-doped by $3\sim5\times10^{18}$ cm$^{-3}$ and 0.7 µm thick), 405 is an AlGaN current blocking layer (Si-doped by $3\sim5\times10^{18}$ cm$^{-3}$ and 0.2 µm thick), 406 is a second AlGaN cladding layer (Mg-doped by $3\sim5\times10^{18}$ cm$^{-3}$ and 0.1 µm thick), 407 is an AlGaN overflow preventing layer, 408 is a GaN guide layer (undoped and 0.1 µm thick), 409 is a MQW (three cycles of $In_{0.2}Ga_{0.8}N/In_{0.03}Ga_{0.97}N$) active layer, 410 is a GaN guide layer (Si-doped by $5\times10^{18}$ cm$^{-3}$ and 0.1 µm thick), 411 is an n-type AlGaN cladding layer (Si-doped by $3\sim5\times10^{18}$ cm$^{-3}$ and 0.8 µm thick), 412 is an n-type GaN contact layer (Si-doped by $3\sim5\times10^{18}$ cm$^{-3}$ and 0.01 µm thick), 413 is a Ga-rich n-type GaN layer (Si-doped by $3\sim5\times10^{18}$ cm$^{-3}$ and 0.01 µm thick), and 414 is an n-side electrode. Numeral 500 denotes a heat sink.

This laser element can be manufactured by epitaxial growth on the sapphire substrate 101. As shown in FIG. 11a, the element structure 401 is grown on the sapphire substrate 101 by MOCVD.

More specifically, layers from the GaN layer 412 to the AlGaN current blocking layer 405 are grown in this sequence on the sapphire substrate 101. After that, the wafer is moved out of the growth chamber of the MOCVD apparatus. Then, a mask is formed on a part of the current blocking layer 405, and the wafer is selectively removed by etching until exposing the cladding layer 406. Thereafter, the portion for a current to flow through is formed, and the cladding layer 404 and the contact layer 403 are grown subsequently.

Next referring to FIG. 11B, laser light is irradiated onto the sapphire substrate 101 from its bottom surface. Then, the GaN layer 412, which functions as the abruption mechanism, is heated rapidly and a dense local heat stress is applied to the abruption mechanism layer 412. Also the layer 412 is decomposed into gallium (Ga) and nitrogen (N) by the electric field, and nitrogen vaporizes. Thus, as shown in FIG. 11, the sapphire substrate 101 can be separated.

Laser light used here preferably has a wavelength maximizing the absorptance of the GaN layer 412 grown on the sapphire substrate 101. More specifically, a nitrogen laser, for example, may be used. To ensure reliable separation of the substrate, density of the irradiated laser light is preferably not less than 20 MW/cm$^2$. However, if the crystal was a polycrystal or a layer containing In (indium) such as InGaN, the substrate could be separated even with a density of irradiated laser light around 1 MW/cm$^2$.

Once the sapphire substrate 101 is separated, GaN is decomposed into gallium (Ga) and nitrogen along the separation surface of the GaN layer 412, and the Ga-rich GaN layer 413 is formed in the presence of dissociated nitrogen.

Electrodes 402 and 414 are formed on the top and bottom surfaces of the element structure 40a obtained by separating the sapphire substrate 101, and the element structure 401 is cleaved into chips. When the n-side electrode 414 is made on the Ga-rich GaN layer 413, the electrode and the GaN layer 413 make an alloy more easily, and it is advantageous in decreasing the contact resistance than conventional ones.

After that, the p-side electrode 402 is bonded to the heat sink 500. For bonding the p-side electrode and the metal heat sink, it is desirable to process their surfaces in a high vacuum by plasma of hydrogen or argon, for example. In this case, the surface of the heat sink is preferably coated with copper (Cu), aluminum (Al) or an alloy of one of them. When they are bonded under these conditions, it is possible to overcome the problem of leakage of current caused by a creep-up part of the metal, which has been a problem accompanying the use of a metal solder with a low melting point, such as In (indium), gallium (Ga), tin (Sn) or lead (Pb).

A laser device manufactured through these processes was actually operated. As a result, it continuously oscillated with the threshold value 70 mA at a room temperature. The oscillation wavelength was 410 nm, and operation voltage was 3.1 V. Additionally, it was mounted on a heat sink without interposing a sapphire substrate. As a result, the heat dissipation property of the laser was improved by five times as compared with conventional ones. Since the cavity edges can be made reliably by cleavage, the facet reflectance is high. Also when a high reflectance coat is provided, the surface is less coarse, and a high reflectance is obtained easily. These effects contribute to improvements of various characteristics including the threshold value.

Additionally, although conventional elements made on sapphire substrates are made by forming a mesa and forming both the p-side electrode and the n-side electrode on a common side, the structure according to the embodiment of the invention decreases the leak current.

Moreover, since the finished element does not include the sapphire substrate which is different in thermal expansion coefficient from nitride compound semiconductors, distortion by heat generated during operation of the laser can be prevented, and the lifetime of the element is improved. Furthermore, since the embodiment is free from optical reflection occurring along the interface between the sapphire substrate and the GaN layer in a conventional element, the oscillation mode of the element is stabilized, and its threshold value decreases.

Furthermore, the instant embodiment also contributes to a remarkable reduction of the manufacturing cost by re-using the separated sapphire substrate.

In conventional elements, the total thickness was approximately 100 μm for easier handling in the process and because of a substrate used for the crystal growth, although it is somewhat thinned by polishing or abrasion, for example. Such a thick element, however, is subject to a high heat resistance and a high heat capacitance when radiating heat generated especially from the active layer of the element. Additionally, when the thickness exceeds a certain limit, distortion in the element increases due to distribution of the heat, and this invites a deterioration of its property.

The Inventor made investigation about such relations between the thickness of an element and its property. The table given below shows relations between thicknesses and lifetimes of elements obtained by a lifetime test.

| Thickness (μm) | 10 | 20 | 30 | 50 | 70 |
|---|---|---|---|---|---|
| Element A | $10^5$ | $10^5$ | $6 \times 10^4$ | $9 \times 10^3$ | $6 \times 10^3$ |
| Element B | $10^5$ | $10^5$ | $10^5$ | $8 \times 10^4$ | $6 \times 10^4$ |
| Element C | $10^5$ | $10^5$ | $4 \times 10^4$ | $6 \times 10^{53}$ | $4 \times 10^2$ |
| | | | | | (in hours) |

Element A is a laser element in which the nitride layer in contact with the heat sink is GaN. Element B is a laser element in which the nitride layer in contact with the heat sink is AlGaN (Al composition being 5%). Element C is a laser element in which the nitride layer in contact with the heat sink is InGaN (In composition being 10%). In any of these element structures, the lifetime is getting better as the element becomes thinner. Although there is a difference among different element structures, the lifetime is stabilized when the element becomes thinner than 20 μm. That is, in the instant embodiment, a good lifetime is ensured by thinning the element portion to 20 μm or less.

Even when the thickness of the element portion obtained by separating the sapphire substrate is 20 μm or less, the element portion can be made by an existing manufacturing method as well in ordinary cases. However, if its handling is not easy, before it is separated from the sapphire substrate, the p-side electrode may be formed and an appropriate substrate may be bonded for easier handling. In this case, the bonded substrate is preferably a cleavable substrate and bonded to align its cleavable direction in parallel with the GaN layer of the element. In this manner, cleavage for making laser facets will go forth smoothly. Examples of this substrate are Si, SiC, GaAs, InP, GaP, GaP and GaN. This substrate may be separated when the main process is completed. In this manner, even when the element is thin, it can be handled more easily, and its manufacturing efficiency can be improved.

Next explained is the second specific example of this embodiment.

FIG. 13 is a cross-sectional view schematically showing the second example of this embodiment.

That is, FIG. 13 shows an element structure formed on a sapphire substrate 101. In FIG. 13, the same reference numerals are attached to common components, and detailed explanation thereof is omitted.

The example of FIG. 13 is directed to reducing crystal defects by employing so-called lateral growth for the crystal growth. More specifically, after a GaN layer 502 is grown on the sapphire substrate 101, the wafer is removed from the growth chamber, and a $SiO_2$ layer 503 is formed to cover a part of the GaN layer 502. Thereafter, the waver is gain introduced into the MOCVD apparatus, and, a GaN layer 504 is grown by lateral growth which makes GaN to grow in parallel with the surface from the GaN layer 502 exposed to a gap in the $SiO_2$ layer 503 as the core of the crystal growth.

After that, layers from the n-type contact layer 412 to the p-type contact layer 403 are grown. FIG. 13 shows this status. Subsequently, laser light is irradiated onto the sapphire substrate 101 from its bottom surface to thereby separate the substrate 101, and the GaN layer 504, $SiO_2$ layer 503 and GaN layer 504 are removed by dry etching to expose the contact layer 412. By further making n-side and p-side electrodes, the laser element is completed.

According to this modified example, by employing so-called lateral growth for epitaxially growing nitride compound semiconductors on the sapphire substrate 101, it is possible to remarkably decrease the crystal defects of respective layers of the element and to improve its emission property, electric property and lifetime.

Next explained is the third specific example of this embodiment.

FIG. 14 is a cross-sectional view schematically showing the third specific example of this embodiment. That is, FIG. 14 shows an element structure formed on the sapphire substrate 101. After a GaN layer 601 is first grown on the sapphire substrate 101, the wafer is removed from the growth apparatus, and its surface excluding a part thereof is covered by a $SiO_2$ film 602. After that, growth is continued again. That is, sequentially grown are a GaN buffer layer 603, InGaN layer 604, n-type GaN layer 605, n-type GaN/AlGaN super-lattice cladding layer 606 (having a total thickness of 0.8 μm and including a GaN layer, undoped and 40 nm thick, and an AlGaN layer, Si-doped by $3\sim5\times10^{18}$ $cm^{-3}$ and 40 nm thick), GaN light confinement layer 607 (undoped and 0.1 μm thick), $In_{0.2}Ga_{0.8}N$/GaN-MQW active layer 608 (undoped and having three cycles of 2 nm thick well layers and 4 nm thick barrier layers), GaN light confinement layer 609 (undoped and 0.1 μm thick), first $Al_{0.03}Ga_{0.97}N$ cladding layer 610 (Mg-doped by $1\times10^{18}$ $cm^{-3}$, Si-doped by $1\times10^{17}$ $cm^{-3}$ and 0.1 μm thick) and n-type $Al_{0.03}Ga_{0.97}N$ current blocking layer 611 (Si-doped by $1\times10^{18}$ $cm^{-3}$, Si-doped by $1\times10^{17}$ $cm^{-3}$ and 0.1 μm thick).

After that, the wafer is moved out of the growth chamber, and the portion for a current to flow in is selectively removed by etching until exposing the first cladding layer 610, and a second p-type $Al_{0.03}Ga_{0.97}N$ cladding layer 612 (Mg-doped by $1\times10^{18}$ $cm^{-3}$, Si-doped by $1\times10^{17}$ $cm^{-3}$ and 0.1 μm thick) and an n-type GaN contact layer 613 are grown. FIG. 14 shows this status.

Thereafter, the substrate 101 is separated by irradiating laser light onto the sapphire substrate 101 from its bottom surface. The laser light preferably has a wavelength transparent to GaN and maximizing the absorptance of InGaN. Thus, the laser light is absorbed by the InGaN layer 604, InGaN is decomposed by the electric field, and the GaN layer 601, $SiO_2$ film 602 and GaN buffer layer 603 are separated together with the sapphire substrate 101.

If the composition ratio of In (indium) in the InGaN layer 604 is around 20%, desirable wavelength of the laser light is approximately 400 nm.

After separation, electrodes are made on opposite surfaces of the element, and the element structure is cleaved into chips. By mounting the chip on the heat sink 500, the semiconductor laser device shown in FIG. 15 is completed.

FIG. 16 is a cross-sectional view schematically showing an example in which both the p-side electrode and the n-side electrode are formed on a surface opposite from the heat sink 500. Similarly to the foregoing example, this laser element can be made by crystallographically growing respective layers on the sapphire substrate and then separating the substrate by irradiating laser light onto the substrate from its bottom surface. The structure of the element shown in FIG. 16 is generally the same as that explained with reference to FIG. 8. So, labeling common reference numerals, detailed explanation there of is omitted.

This embodiment also ensures easy and reliable separation of the sapphire substrate and thereby attains the same effects as those of the first and second embodiments explained above. Additionally, this embodiment improves the lifetime as explained above by making the element obtained by separating the sapphire substrate as thin as 20 $\mu$m or less.

Next explained is a stacked laser obtained by the present invention.

FIG. 17 is a diagram schematically showing a structure of the stacked laser obtained by the present invention. That is, the stacked laser 700 according to the invention is made by stacking laser elements 701 in vertical and horizontal directions. A heat sink 702 is interposed between every two adjacent laser elements 701, and it also has the role of an electrode. Additionally, a positive electrode 710 is provided on one end, and a negative electrode 720 is provided at the other end. The laser element 701 can be manufactured by the techniques explained as the first to third embodiments, and it has the p-side contact and the n-side contact on the upper and lower surfaces, respectively. The current is injected through upper and lower electrodes 710 and 720.

The stacked laser promises a super-high output. Although FIG. 17 illustrates a laser stacking laser elements 701 in fine lines and five columns. However, any number of elements may be stacked. According to the invention, since these laser elements 701 have no sapphire substrate, a stacked laser excellent in heat radiation and very compact can be obtained. The laser beam obtained by the laser can make substantially the same spot size as those of solid-state lasers or gas lasers can be obtained, and parallel beams of a large diameter can be obtained.

According to the invention, by especially utilizing a high output and a small beam spot size and utilizing the nature of a semiconductor laser that it can be modulated quickly, an ideal stacked laser also usable as the light source of a laser projector can be realized.

The Inventor actually injected a current into the laser of FIG. 17 in an experiment. As a result, the laser exhibited the emission property of releasing an output of 90 W under the operation voltage of 15V, oscillation threshold value of 150 mA and operation current of 10A. Since the thickness of the laser element 701 forming the stacked laser is approximately 20 $\mu$m, the laser stacking the elements in five stages is as thin as several mm in total, even adding the thickness of the layers of the heat sink 702.

In conventional high-output stacked lasers, each laser element before being stacked was as thin as 100 $\mu$m when measured between its electrodes. That is, emission points of respective laser elements were distant by the large thickness of the element. In this laser, laser beams emitted from respective elements are independent and discrete from each other, and the influence of light from a certain element to an adjacent element was very small.

In contrast, according to the invention, since each laser element 701 is as thin as approximately 20 $\mu$m, emission points of respective elements are very close to each other, and each laser element is affected by light from an adjacent laser element. As a result, each laser element 701 is more readily excited by light from the active layer of an adjacent element, and the emission efficiency increases accordingly.

FIG. 18 is a diagram showing a modified example of the stacked laser according to the invention. In the stacked laser shown here, a diamond thin film is used as the heat sink 704, and an electrode 703 for injecting a current therethrough is made on the diamond thin film 704 by patterning. Thus, each laser element 701 can be controlled independently.

Additionally, in order to bond the electrode of each element 701 to the electrode on the heat sink 704, by processing their surfaces in a high vacuum by plasma of hydrogen or argon prior to the bonding, it is possible to overcome the problem of leakage of current caused by a creep-up part of the metal, which has been a problem accompanying the use of a metal solder with a low melting point.

Furthermore, when a pressure is applied from the upper and lower sides of the heat sink 704, a distortion is produced in crystals, band splitting of valence bands occurs, and the state density becomes smaller. Therefore, the threshold value can be decreased. Simultaneously, the contact force is improved toward decreasing the heat resistance.

By actually using the stacked lasers according to the invention in a laser projector, a high-luminance, high-quality projector acceptable for enjoying outdoor in the day time was realized even with a large screen as large as 1000 inches. Although a conventional projector using gas lasers had been as heavy as 1500 kg, the projector device the Inventor made was reduced in weight to 50 kg.

Heretofore, embodiments of the invention have been explained while referring to some specific examples. However, the invention is not limited to these examples.

For example, in lieu of the sapphire substrate used in these examples, any other substrates, such as insulating substrate of spinel, MgO, $ScAlMgO_4$, $LaSrGaO_4$, (LaSr) $(AlTa)O_3$, or the like, or electrically conducting substrate of SiC, Si, Ge, GaAs, or the like, may be used similarly to obtain their respective effects. A II-VI compound semiconductor is also usable as the substrate. In case of a $ScAlMgO_4$ substrate, its (0001) plane is preferably used. In case of a (LaSr) $(AlTa)O_3$ substrate, its (111) plane is preferably used.

Structures of light emitting elements shown as specific examples are not but free examples, and any skilled in the art will be able to modify them in various ways. For example, conduction types of stacked layers may be inverted, and it is also possible to employ a multiquantum well structure as the active layer or to employ any of other various current blocking structures.

Furthermore, the invention is not limited to semiconductor lasers, but similarly applicable also to light emitting diodes and other light emitting elements using nitride compound semiconductors to attain the same effects.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No. H10-272286 filed on Sep. 25, 1998 including specification, claims, drawings and summary is incorporated herein by reference in its entirety.

What is claimed is:

1. A method for manufacturing a semiconductor light emitting element, comprising the steps of:

forming on a single crystal substrate an abruption mechanism susceptible to a stress;

growing an epitaxial base layer of a nitride compound semiconductor on said abruption mechanism;

growing an epitaxial light emitting layer of a nitride compound semiconductor on said epitaxial base layer; and separating said epitaxial base layer from said substrate by applying a stress to said abruption mechanism before or after said step of growing an epitaxial light emitting layer.

2. The method according to claim 1 wherein said abruption mechanism is a lift-off layer including at least either crystal defect or deficiencies.

3. The method according to claim 2 wherein said lift-off layer is an AlGaN layer including cracks or an InGaN layer including pits.

4. The method according to claim 3 wherein said step of separating said epitaxial base layer from said substrate includes a step of changing a temperature of said abruption mechanism.

5. The method according to claim 3 wherein said step of separating said epitaxial base layer from said substrate includes a step of applying an ultrasonic wave to said abruption mechanism.

6. The method according to claim 3 wherein said step of separating said epitaxial base layer from said substrate includes a step of irradiating said abruption mechanism with a laser light.

7. The method according to claim 3 wherein said substrate is made of sapphire.

8. The method according to claim 1 wherein said abruption mechanism is recesses of said substrate.

9. The method according to claim 8 wherein said step of forming said abruption mechanism includes a step of forming a seed layer of nitride compound semiconductor on said substrate, and said abruption mechanism is recesses of said substrate formed through said seed layer.

10. The method according to claim 8 wherein said recesses have a mask layer on their bottom in order to prevent growth of nitride compound semiconductor.

11. The method according to claim 8 wherein said step of separating said epitaxial base layer from said substrate includes a step of changing a temperature of said abruption mechanism.

12. The method according to claim 8 wherein said step of separating said epitaxial base layer from said substrate includes a step of applying an ultrasonic wave to said abruption mechanism.

13. The method according to claim 8 wherein said step of separating said epitaxial base layer from said substrate includes a step of irradiating said abruption mechanism with a laser light.

14. The method according to claim 8 wherein said substrate is made of sapphire.

15. A semiconductor light emitting element fabricated by the steps of:

forming on a single crystal substrate an abruption mechanism susceptible to a stress;

growing an epitaxial base layer of a nitride compound semiconductor on said abruption mechanism;

growing an epitaxial light emitting layer of a nitride compound semiconductor on said epitaxial base layer; and separating said epitaxial base layer from said substrate by applying a stress to said abruption mechanism before or after said step of growing an epitaxial light emitting layer.

16. A semiconductor light emitting element fabricated by the steps of:

forming on a single crystal substrate an abruption mechanism susceptible to a stress;

growing an epitaxial base layer of a nitride compound semiconductor on said abruption mechanism;

growing an epitaxial light emitting layer of a nitride compound semiconductor on said epitaxial base layer; and separating said epitaxial base layer from said substrate by applying a stress to said abruption mechanism before or after said step of growing an epitaxial light emitting layer;

wherein:

said step of forming said abruption mechanism includes a step of forming a seed layer of nitride compound semiconductor on said substrate, said abruption mechanism is recesses of said substrate formed through said seed layer, and an electrode is formed onto a surface of said seed layer which was separated from said substrate by said step of separating said epitaxial base layer from said substrate.

17. The method of claim 3, wherein said separation of said epitaxial base layer from said substrate starts from said cracks or said pits.

18. The method of claim 3, wherein an Al composition of said AlGaN layer is in a range from 10% to 30%.

19. The method of claim 3, wherein an In composition of said InGaN layer is not less than 10%.

20. The method of claim 4, wherein said step of separating said epitaxial base layer from said substrate includes:

decreasing a temperature after growth of said epitaxial light emitting layer.

21. The method of claim 5, wherein said separation of said epitaxial base layer from said substrate starts from said cracks or said pits by applying said ultrasonic wave.

22. The method of claim 6, wherein said separation of said epitaxial base layer from said substrate starts from said cracks or said pits by irradiating with said laser light.

23. A semiconductor light emitting element fabricated by:
   forming on a single crystal substrate a lift-off layer susceptible to a stress, wherein said lift-off layer is an AlGaN layer including cracks or an InGaN layer including pits;
   growing on an epitaxial base layer of a nitride compound semiconductor on said lift-off layer;
   growing an epitaxial light emitting layer of a nitride compound semiconductor on said epitaxial base layer; and
   separating said epitaxial base layer from said substrate by applying a stress to said lift-off layer before or after said step of growing an epitaxial light emitting layer.

24. The semiconductor light emitting element of claim 23, wherein said separation of said epitaxial base layer from said substrate starts from said cracks or said pits.

25. The semiconductor light emitting element of claim 23, wherein an Al composition of said AlGaN layer is in a range from 10% to 30%.

26. The semiconductor light emitting element of claim 23, wherein an In composition of said InGaN layer is not less than 10%.

* * * * *